United States Patent
Ma et al.

(10) Patent No.: US 11,830,567 B2
(45) Date of Patent: Nov. 28, 2023

(54) INTEGRATED CIRCUIT DEVICE

(71) Applicant: SAMSUNG ELECTRONICS CO., LTD., Suwon-si (KR)

(72) Inventors: Jinwon Ma, Hwaseong-si (KR); Chunhyung Chung, Seoul (KR); Jamin Koo, Hwaseong-si (KR); Kyuwan Kim, Suwon-si (KR); Daeyoung Moon, Seoul (KR); Wonseok Yoo, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 204 days.

(21) Appl. No.: 17/372,697

(22) Filed: Jul. 12, 2021

(65) Prior Publication Data
US 2022/0172749 A1    Jun. 2, 2022

(30) Foreign Application Priority Data
Dec. 2, 2020    (KR) .................. 10-2020-0166962

(51) Int. Cl.
*G11C 5/06*    (2006.01)
*H01L 23/528*    (2006.01)
*H01L 23/522*    (2006.01)
*H01L 23/532*    (2006.01)
*H10B 12/00*    (2023.01)

(52) U.S. Cl.
CPC .......... *G11C 5/063* (2013.01); *H01L 23/5226* (2013.01); *H01L 23/5283* (2013.01); *H01L 23/532* (2013.01); *H10B 12/0335* (2023.02); *H10B 12/315* (2023.02); *H10B 12/482* (2023.02)

(58) Field of Classification Search
CPC .. G11C 5/063; H10B 12/482; H10B 12/0335; H10B 12/315; H01L 23/5226; H01L 23/5283; H01L 23/532
USPC ........................................................ 257/296
See application file for complete search history.

(56) References Cited

U.S. PATENT DOCUMENTS

| | | | |
|---|---|---|---|
| 6,169,313 B1 * | 1/2001 | Tsutsumi | H10B 10/12 257/E27.099 |
| 6,455,424 B1 | 9/2002 | McTeer et al. | |
| 6,797,570 B2 | 9/2004 | Shin et al. | |
| 7,112,488 B2 | 9/2006 | Helm et al. | |
| 2005/0285148 A1 | 12/2005 | Chen et al. | |
| 2006/0160343 A1 | 7/2006 | Chong et al. | |
| 2007/0128787 A1 | 6/2007 | Higashitani | |
| 2008/0242084 A1 | 10/2008 | Kim et al. | |

* cited by examiner

*Primary Examiner* — Tu-Tu V Ho
(74) *Attorney, Agent, or Firm* — Fish & Richardson P.C.

(57) ABSTRACT

An integrated circuit device includes; word lines extending in a first direction across a substrate and spaced apart in a second direction different from the first direction, bit lines extending on the word lines in the second direction and spaced apart in the first direction, a first contact plug arranged among the bitlines, contacting a first active region of the substrate, having a first width, and having a first dopant concentration, and a second contact plug arranged among the bitlines, contacting a second active region of the substrate, having a second width, and having a second dopant concentration less than the first dopant concentration.

20 Claims, 23 Drawing Sheets

INTEGRATED CIRCUIT DEVICE

CROSS-REFERENCE TO RELATED APPLICATION

This application claims priority under 35 U. S. C. § 119 to Korean Patent Application No. 10-2020-0166962 filed on Dec. 2, 2020 in the Korean Intellectual Property Office, the subject matter of which is hereby incorporated by reference.

BACKGROUND

The inventive concept relates generally to integrated circuit devices. More particularly, the inventive concept relates to integrated circuit devices including contact plugs.

As integrated circuit devices have become more densely integrated, the sizes of various contact plugs included in the integrated circuit devices have been reduced, and distributions of contact plug sizes have increased. In addition, as integrated circuit devices have become more densely integrated, resistance distributions of the contact plugs have increased. However, as resistance distributions of the contact plugs increase, electrical performance and the overall reliability of integrated circuit devices may deteriorate.

SUMMARY

Embodiments of the inventive concept relate to integrated circuit devices capable of preventing deterioration of electrical performance and overall reliability by reducing resistance distributions of contact plugs, although size distributions of the contact plugs may increase.

According to an aspect of the inventive concept, there is provided an integrated circuit device including; a substrate, a first active region and a second active region spaced apart in the substrate, a first contact plug contacting the first active region and having a first width and a first dopant concentration, and a second contact plug contacting the second active region and having a second width greater than the first width and a second dopant concentration less than the first dopant concentration.

According to an aspect of the inventive concept, there is provided an integrated circuit device including; a first active region, a second active region and a third active region spaced apart in a substrate, a first contact plug having a first width and a first dopant concentration, and contacting at least part of the first active region, a second contact plug having a second width and a second dopant concentration less than the first dopant concentration, and contacting at least a part of the second active region, and a third contact plug having a third width, having a third dopant concentration less than the first dopant concentration and less than the second dopant concentration, and contacting at least part of the third active region.

According to an aspect of the inventive concept, there is provided an integrated circuit device including; word lines extending in a first direction across a substrate and spaced apart in a second direction different from the first direction, bit lines extending on the word lines in the second direction and spaced apart in the first direction, a first contact plug arranged among the bitlines, contacting a first active region of the substrate, having a first width, and having a first dopant concentration, and a second contact plug arranged among the bitlines, contacting a second active region of the substrate, having a second width, and having a second dopant concentration less than the first dopant concentration.

BRIEF DESCRIPTION OF THE DRAWINGS

Embodiments of the inventive concept may be more clearly understood upon consideration of the following detailed description together with the accompanying drawings in which.

DETAILED DESCRIPTION

Throughout the written description and drawings, like reference numbers and labels denote like or similar elements, components and/or features. Certain embodiments of the inventive concept may be described in relation to an assumed set of geometric directions, including a first direction (e.g., a first horizontal or X direction), a second direction (e.g., a second horizontal or Y direction), and a third direction (e.g., a vertical or Z direction). In this regard, the terms "horizontal" and "vertical" may be related in geometric relation to a principal surface of a substrate (e.g., substrate 20 described hereafter).

Figure 1:
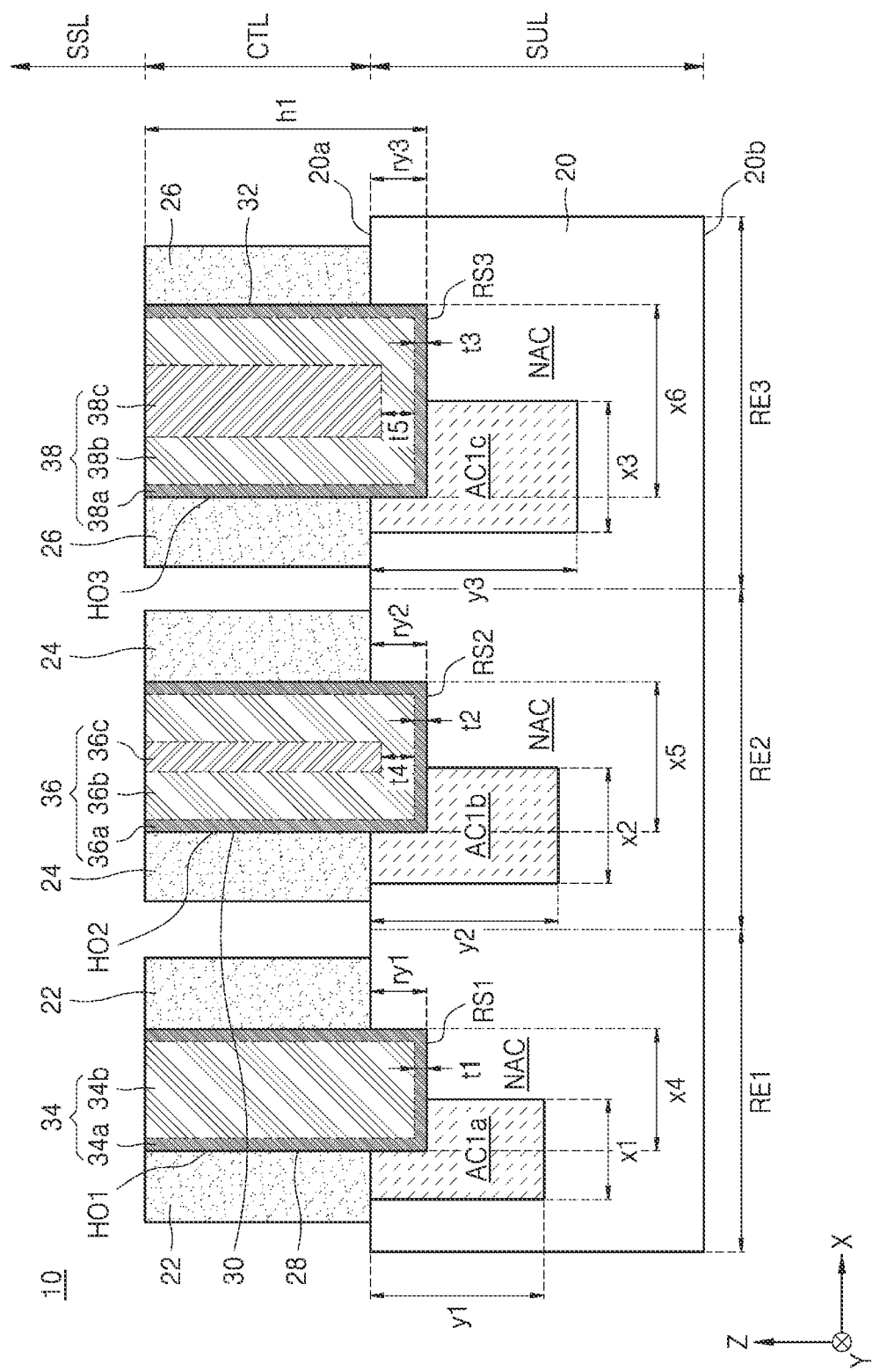
FIGS. 1, 2, 3, 4, and 5 are respective cross-sectional views illustrating integrated circuit devices according to embodiments of the inventive concept.

FIG. 1 is a cross-sectional view of an integrated circuit device 10 according to embodiments of the inventive concept.

Here, the integrated circuit device 10 includes first, second and third (hereafter collectively, "first to third") regions RE1, RE2, and RE3 in a substrate 20. The first region RE1, the second region RE2, and the third region RE3 may be respectively spaced apart in the first direction. However, in some embodiments, the integrated circuit device 10 may include only two regions (e.g., the first region RE1 and the second region RE2, or the first region RE1 and the third region RE3, etc.).

The integrated circuit device 10 may include first to third active regions AC1a, AC1b, and AC1c spaced apart in the substrate 20. The first to third active regions AC1a, AC1b, and AC1c may include the same material as the substrate 20. The first to third active regions AC1a, AC1b, and AC1c and the substrate 20 may configure as a substrate level SUL. Portions of the substrate 20, other than the first to third active regions AC1a, AC1b, and AC1c, may be understood as an inactive region NAC (e.g., a field insulating layer). In some embodiments related to the integrated circuit device 10 of FIG. 1, the first active region AC1a may be formed in the first region RE1 of the substrate 20.

In some embodiments, the substrate 20 may be a semiconductor substrate (e.g., a silicon substrate). That is, the substrate 20 may include silicon (e.g., monocrystalline silicon, polycrystalline silicon (polysilicon), and/or amorphous silicon). In some embodiments, the substrate 20 may include at least one of germanium (Ge), silicon germanium (SiGe), silicon carbide (SiC), gallium arsenide (GaAs), indium arsenide (InAs), and indium phosphide (InP).

The substrate 20 may include an upper surface 20a and a lower (or rear) surface 20b. The first active region AC1a may have a first width x1, where "width" is measured in the first direction. The first active region AC1a may be formed from the upper surface 20a of the substrate 20 to a first depth y1, where "depth" is measured in the third direction. In some embodiments, the first width x1 may range from between about several nanometers (nms) to about tens of nms, and the first depth y1 may range from about tens of nms to about hundreds of nms.

In the first region RE1 of the substrate 20, a first recessed portion RS1 may be formed on one side of the first active region AC1a. The first recessed portion RS1 may be obtained by etching the upper surface 20a of the substrate 20 to a first recess depth ry1. In some embodiments, the first recess depth ry1 may range from about several nms to about tens of nms.

In the integrated circuit device 10, the second active region AC1b may be formed in the second region RE2 of the substrate 20. The second active region AC1b may have a second width x2. The second width x2 of the second active region AC1b may be greater than the first width x1 of the first active region AC1a. The second active region AC1b may be formed in the upper surface 20a of the substrate 20 to a second depth y2, wherein the second depth y2 of the second active region AC1b may be greater than the first depth y1 of the first active region AC1a. In some embodiments, the second width x2 of the second active region AC1b may range from about several nms to about tens of nms, and the second depth y2 of the second active region AC1b may range from about several nms to about hundreds of nms.

In the second region RE2 of the substrate 20, a second recessed portion RS2 may be formed in the upper surface 20a of the substrate 20 on one side of the second active region AC1b. The second recessed portion RS2 may be obtained by etching the upper surface 20a of the substrate 20 to a second recess depth ry2, wherein the second recess depth ry2 of the second recessed portion RS2 may be equal to the first recess depth ry1 of the first recessed portion RS1.

In the integrated circuit device 10, the third active region AC1c may be formed in the third region RE3 of the substrate 20. The third active region AC1c may have a third width x3, wherein the third width x3 of the third active region AC1c may be greater than the second width x2 of the second active region AC1b. Here, the third active region AC1c may be formed in the upper the surface 20a of the substrate 20 to a third depth y3, wherein the third depth y3 of the third active region AC1c may be greater than the second depth y2 of the second active region AC1b. In some embodiments, the third width x3 may range from about several nms to about tens of nms, and the third depth y3 may range from about several nms to about hundreds of nms.

In the third region RE3 of the substrate 20, a third recessed portion RS3 may be formed in the upper surface 20a of the substrate 20 on one side of the third active region AC1c. In this regard, the third recessed portion RS3 may be obtained by etching the upper surface 20z of the substrate 20 to a third recess depth ry3, wherein the third recess depth ry3 of the may be equal to the second recess depth ry2 of the second recessed portion RS2.

Alternately or additionally, the integrated circuit device 10 may include first to third contact plugs 34, 36, and 38 spaced apart on the substrate 20 and respectively contacting the first to third active regions AC1a, AC1b, and AC1c. The first to third contact plugs 34, 36, and 38 may be formed on the substrate 20 in the third direction. In some embodiments, each of the first to third contact plugs 34, 36, and 38 may include a silicon layer (e.g., a polysilicon layer).

The first to third contact plugs 34, 36, and 38 may respectively contact parts of the first to third active regions AC1a, AC1b, and AC1c. The first to third contact plugs 34, 36, and 38 may be respectively buried in the first to third recessed portions RS1, RS2, and RS3. The first to third contact plugs 34, 36, and 38 may configured as a contact level CTL disposed on the substrate level SUL. An additional semiconductor layer level SSL may be formed on the contact level CTL. In some embodiments, the first to third contact plugs 34, 36, and 38 may be buried contact plugs.

Referring to the integrated circuit device 10 of FIG. 1, the first contact plug 34 contacting the first active region AC1a may be formed in the first region RE1 of the substrate 20. The first contact plug 34 may have a fourth width x4 and a first height h1, wherein "height" is measured in the third direction. In some embodiments, the fourth width x4 may range from about several nms to about tens of nms, and the first height h1 may range from about several nms to about hundreds of nms.

The first contact plug 34 may be a silicon plug doped with one or more dopant(s), such as phosphor (P) and arsenic (As). The first contact plug 34 may be doped to a first dopant concentration. For example, when the first contact plug 34 is doped with phosphor, the first dopant concentration may range from about $9E19/cm^3$ to about $1E20/cm^3$.

In the foregoing and through the written description, a "dopant" may be understood as one or more selected impurities, and a "dopant concentration" may be understood as a particular concentration of the one or more impurities.

The first contact plug 34 may be buried in a first contact hole HO1 formed in a first semiconductor structure 22. The first contact hole HO1 may have an aspect ratio of no less than 10. The first contact plug 34 may be buried in the first recessed portion RS1 of the substrate 20. The first semiconductor substrate 22 may include a first bit line structure.

The first contact plug 34 may include a first seed layer 34a and a first semiconductor layer 34b. The first semiconductor layer 34b may be a single layer doped with a dopant. The first semiconductor layer 34b may have a first dopant concentration equal to the first dopant concentration of the first contact plug 34. Hereafter, a contact plug formed from silicon doped with one or more dopants may be referred to as a "doped silicon plug."

The first seed layer 34a may be formed on an inner wall of the first contact hole HO1 in order to uniformly form the first semiconductor layer 34b. The first seed layer 34a may have a first thickness t1. However, the first seed layer 34a may be omitted. In some embodiments, the first seed layer 34a may include a silicon layer or a doped silicon layer (e.g., a polysilicon layer or a doped polysilicon layer). The first semiconductor layer 34b may be buried in the first contact hole HO1 on the first seed layer 34a and may be a silicon layer doped with a dopant, for example, P or As, for example, a polysilicon layer. The first semiconductor layer 34b may be a single silicon layer doped with a dopant, for example, a polysilicon layer.

In some embodiments, the first contact plug 34 may be a semiconductor layer obtained by depositing a doped silicon layer in the first contact hole HO1 and then, entirely or partially melting and/or annealing (hereafter for simply, "annealing") the doped silicon layer. That is, the first contact plug 34 may be a semiconductor layer obtained by entirely or partially annealing the first semiconductor layer 34b doped with a dopant.

In some embodiments, when the first contact plug 34 is manufactured by entirely or partially annealing the doped silicon layer, the first contact plug 34 may be a semiconductor layer without void or seam. Hereafter, a semiconductor layer without void or seam will be referred to as a "holistic semiconductor layer." The first contact plug 34 may be a contact material layer without void or seam. Hereafter, a contact material layer without void or seam will be referred to as a "holistic contact material layer."

In FIG. 1, by way of illustrative example, the first contact plug 34 is shown as a body divided into the first seed layer 34a and the first semiconductor layer 34b. However, the first contact plug 34 may be implemented as a single body without discrete division between the first seed layer 34a and the first semiconductor layer 34b.

In the integrated circuit device 10, the second contact plug 36 contacting the second active region AC1b may be formed in the second region RE2 of the substrate 20. The second contact plug 36 may have a fifth width x5, wherein the fifth width x5 of the second contact plug 36 may be greater than the fourth width x4 of the first contact plug 34. In some embodiments, the fifth width x5 may range from about several nms to about tens of nms. The second contact plug 36 may have the first height h1 equal to that of the first contact plug 34.

The second contact plug 36 may be a doped silicon plug, and may have a second dopant concentration less than the first dopant concentration of the first contact plug 34. For example, when the second contact plug 36 may be doped with phosphor, and the second dopant concentration may range from about $9E19/cm^3$ to about $1E20/cm^3$.

The second contact plug 36 may be buried in a second contact hole HO2 formed in a second semiconductor structure 24. The second contact hole HO2 may have an aspect ratio of no less than 10. The second contact plug 36 may be buried in the second recessed portion RS2 of the substrate 20. The second semiconductor structure 24 may include a second bit line structure.

The second contact plug 36 may include a second seed layer 36a, a second semiconductor layer 36b, and a third semiconductor layer 36c. The second contact plug 36 may include a multilayer having the second semiconductor layer 36b and the third semiconductor layer 36c. The second semiconductor layer 36b may have the first dopant concentration equal to the first semiconductor layer 34b of the first contact plug 34. The third semiconductor layer 36c may have a second dopant concentration less than the first dopant concentration. Here, the sum of the first dopant concentration of the second semiconductor layer 36b and the second dopant concentration of the third semiconductor layer 36c may be the second dopant concentration of the second contact plug 36.

The second seed layer 36a may be formed on an inner wall of the second contact hole HO2 in order to easily form the second semiconductor layer 36b. In some embodiments, the second seed layer 36a may have a second thickness t2 equal to the first thickness t1. However, the second seed layer 36a may be omitted. The second seed layer 36a may include a silicon layer or a doped silicon layer. In some embodiments, the second seed layer 36a may be a polysilicon layer or a doped polysilicon layer.

The second semiconductor layer 36b and the third semiconductor layer 36c may be filled in the second contact hole HO2 on the second seed layer 36a and may be a doped silicon layer. The second semiconductor layer 36b and the third semiconductor layer 36c may be multiple of doped silicon layers. In some embodiments, the second semiconductor layer 36b may have a fourth thickness t4. In some embodiments, the second semiconductor layer 36b and the third semiconductor layer 36c may be doped polysilicon layers.

In some embodiments, the second contact plug 36 may be a semiconductor layer obtained by depositing a doped silicon layer in the second contact hole HO2 and then, entirely or partially annealing the silicon layer doped with a dopant.

That is, the second contact plug 36 may be a doped semiconductor layer obtained by entirely or partially annealing the second semiconductor layer 36b and the third semiconductor layer 36c.

In some embodiments, when the second contact plug 36 is manufactured by entirely or partially annealing a doped silicon layer, the second contact plug 36 may be a holistic semiconductor layer. The second contact plug 36 may be a holistic contact material layer.

Referring to FIG. 1, the second contact plug 36 is shown as a body divided into the second seed layer 36a, the second semiconductor layer 36b, and the third semiconductor layer 36c. However, the second contact plug 36 may be implemented as a single body without discrete division between the second seed layer 36a, the second semiconductor layer 36b, and the third semiconductor layer 36c.

In the integrated circuit device 10, the third contact plug 38 contacting the third active region AC1c may be formed in the third region RE3 of the substrate 20. The third contact plug 38 may have a sixth width x6, wherein the sixth width x6 of the third contact plug 38 may be greater than the fifth width x5 of the second contact plug 36. In some embodiments, the sixth width x6 may range from about several nms to about tens of nms. The third contact plug 38 may have the first height h1 equal to that of the second contact plug 36.

The third contact plug 38 may be a doped silicon plug, wherein the third contact plug 38 may have a third dopant concentration less than the second dopant concentration of the second contact plug 36. For example, assuming the third contact plug 38 is doped with phosphor, the third dopant concentration may range from about $9E19/cm^3$ to about $1E20/cm^3$.

The third contact plug 38 may be buried in a third contact hole HO3 formed in a third semiconductor structure 26. The third contact plug 38 may be buried in the third recessed portion RS3 of the substrate 20. The third semiconductor structure 26 may include a third bit line structure.

The third contact plug 38 may include a third seed layer 38a, a fourth semiconductor layer 38b, and a fifth semiconductor layer 38c. The third contact plug 38 may include a multilayer including the fourth semiconductor layer 38b and the fifth semiconductor layer 38c. The fourth semiconductor layer 38b may have the first dopant concentration equal to that of the first semiconductor layer 34b of the first contact plug 34. The fifth semiconductor layer 38c may have a third dopant concentration less than the first dopant concentration of the fourth semiconductor layer 38b and the second dopant concentration of the third semiconductor layer 36c. That is, the sum of the first dopant concentration of the fourth semiconductor layer 38b and the third dopant concentration of the fifth semiconductor layer 38c may be the third dopant concentration of the third contact plug 38.

The third seed layer 38a may be formed on an inner wall of the third contact hole HO3 in order to uniformly form the fourth semiconductor layer 38b. In some embodiments, the third seed layer 38a may have a third thickness t3 equal to the second thickness t2. However, the third seed layer 38a may be omitted. The third seed layer 38a may include a silicon layer or a doped silicon layer. In some embodiments, the third seed layer 38a may include a polysilicon layer or a doped polysilicon layer.

The fourth semiconductor layer 38b and the fifth semiconductor layer 38c may be buried in the third contact hole HO3 on the third seed layer 38a and may be a doped silicon layer. The fourth semiconductor layer 38b and the fifth semiconductor layer 38c may include multiple doped silicon layers. In some embodiments, the fourth semiconductor layer 38b and the fifth semiconductor layer 38c may include a doped polysilicon layer. In some embodiments, the fourth semiconductor layer 38b may have a fifth thickness t5 equal to the fourth thickness t4.

In some embodiments, the third contact plug 38 may be a semiconductor layer obtained by depositing a doped silicon layer in the third contact hole HO3 and then, entirely or partially annealing the doped silicon layer.

That is, the third contact plug 38 may be a semiconductor layer obtained by entirely or partially annealing the doped fourth semiconductor layer 38b and/or the doped fifth semiconductor layer 38c.

In some embodiments, when the third contact plug 38 is manufactured by entirely or partially annealing the doped silicon layer, the third contact plug 38 may be a holistic semiconductor layer. The third contact plug 38 may be a holistic contact material layer.

Referring to FIG. 1, the third contact plug 38 is shown with a body divided into the third seed layer 38a, the fourth semiconductor layer 38b, and the fifth semiconductor layer 38c. However, the third contact plug 38 may be implemented as a single body without discrete division between the third seed layer 38a, the fourth semiconductor layer 38b, and the fifth semiconductor layer 38c.

In the integrated circuit device 10 of FIG. 1, although respective sizes of the first to third contact plugs 34, 36, and 38 are different, the first to third widths x1, x2, and x3 as well as the first to third depths y1, y2, and y3 of the first to third active regions AC1a, AC1b, and AC1c—ad also the respective dopant concentrations of the first to third contact plugs 34, 36, and 38 may be well controlled. Therefore, the electrical performance or overall reliability of the integrated circuit device 10 may be improved by reducing resistance (e.g., contact resistance) distributions associated with the first to third contact plugs 34, 36, and 38.

The embodiments illustrated in FIGS. 2, 3, 4 and 5 will be described hereafter in comparison with the embodiment illustrated and described in relation to FIG. 1. Thus, description of elements and features common between the embodiment of FIG. 1 and the embodiments of FIGS. 2, 3, 4, and 5 will not be repeated, and only material differences will be emphasized.

Figure 2:
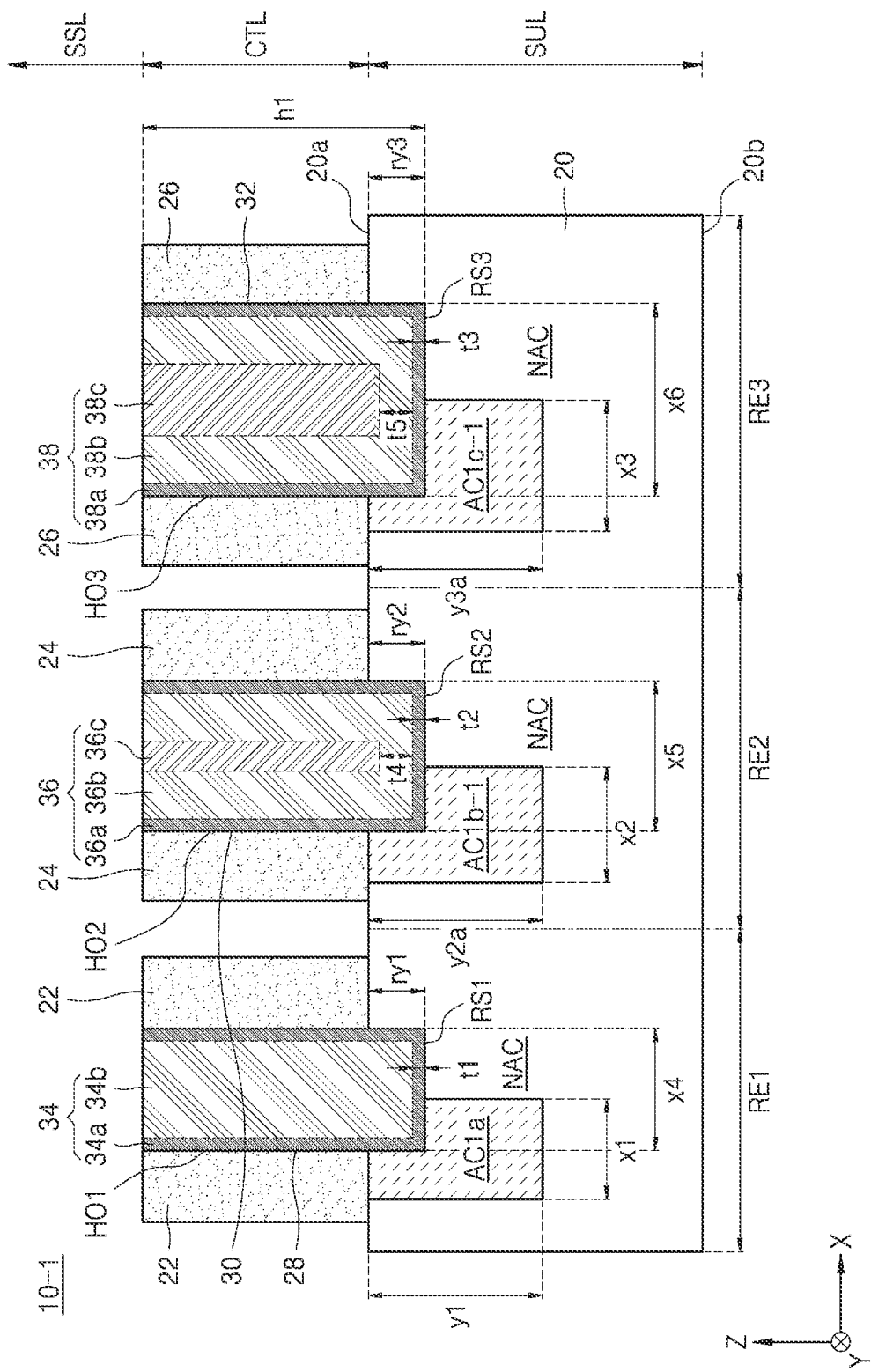

FIG. 2 is a cross-sectional view of an integrated circuit device 10-1 according to embodiments of the inventive concept. Here, the integrated circuit device 10-1 is substantially the same as the integrated circuit device 10 of FIG. 1, except that the respective sizes of first to third depths y1, y2a, and y3a of first to third active regions AC1a, AC1b-1, and AC1c-1 are equal.

More particularly, the integrated circuit device 10-1 may include the first to third active regions AC1a, AC1b-1, and AC1c-1 spaced apart in the substrate 20. The first active region AC1a may be formed in the first region RE1 of the substrate 20. The first active region AC1a may have the first width x1, and be formed in the upper surface 20a of the substrate 20 to a first depth y1.

The second active region AC1b-1 may be formed in the second region RE2 of the substrate 20 and may have the second width x2 greater than the first width x1. However, the second active region AC1b-1 may be formed in the upper surface 20a of the substrate 20 to a second depth y2a equal to the first depth y1 of the first active region AC1a.

The third active region AC1c-1 may be formed in the third region RE3 of the substrate 20 with the third width x3 greater than the second width x2. However, the third active region AC1c-1 may be formed in the upper surface 20a of the substrate 20 to a third depth y3a equal to the second depth y2a of the second active region AC1b-1.

Accordingly, in the integrated circuit device 10-1, although sizes of first to third contact plugs 34, 36, and 38 are different from one another, the first to third widths x1, x2, and x3 of the first to third active regions AC1a, AC1b-1, and AC1c-1 and the respective dopant concentrations of the first to third contact plugs 34, 36, and 38 may be well controlled. Therefore, the electrical performance or overall reliability of the integrated circuit device 10-1 may be improved by reducing resistance (e.g., contact resistance) distributions of the first to third contact plugs 34, 36, and 38.

Figure 3:
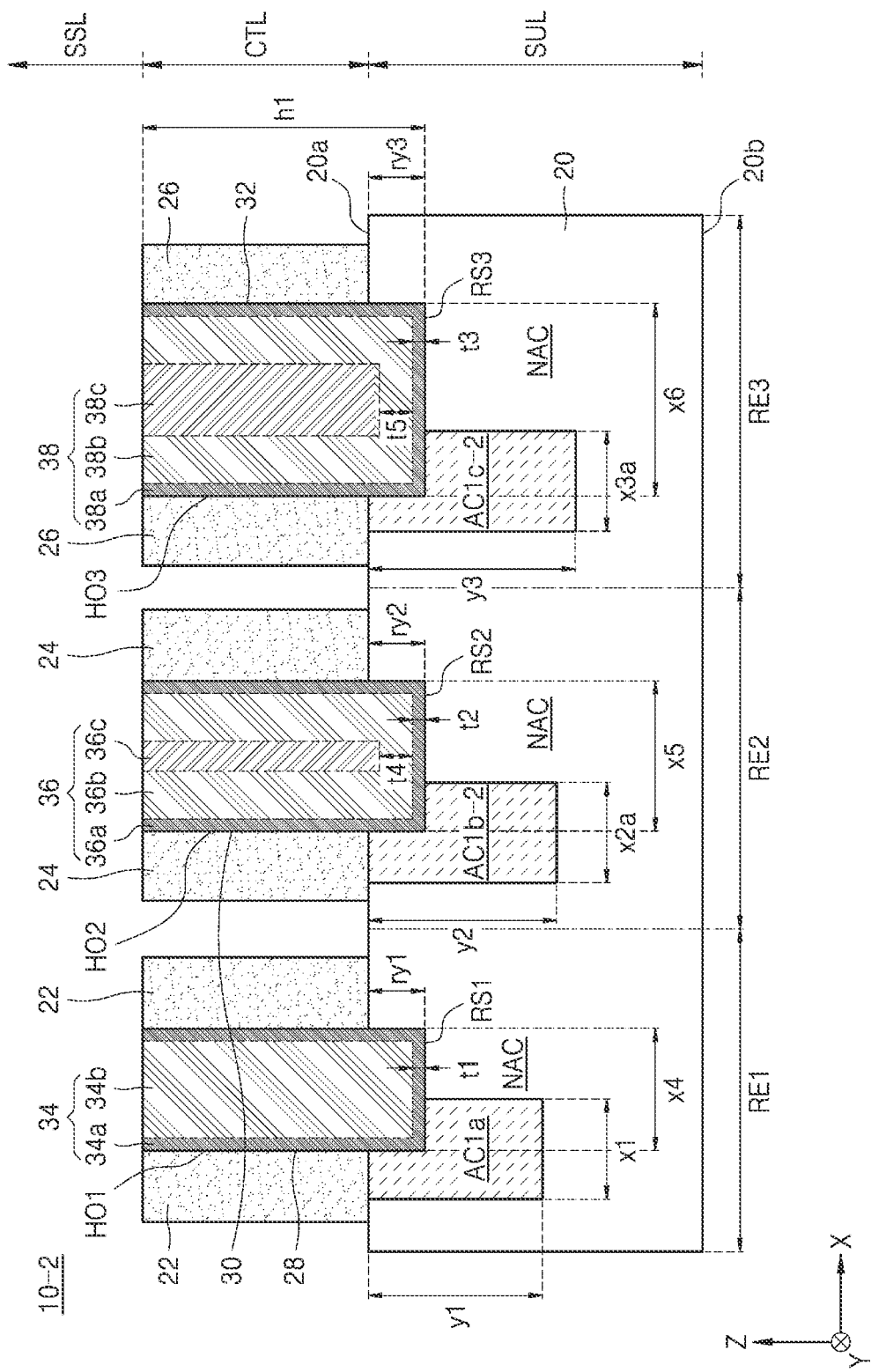

FIG. 3 is a cross-sectional view of an integrated circuit device 10-2 according to an embodiment of the inventive concept. Here, the integrated circuit device 10-2 may be substantially the same as the integrated circuit device 10 of FIG. 1, except that the respective sizes of first to third widths x1, x2a, and x3a of first to third active regions AC1a, AC1b-2, and AC1c-2 are equal.

The integrated circuit device 10-2 may again include the first to third active regions AC1a, AC1b-2, and AC1c-2 spaced apart in the substrate 20. The first active region AC1a may be formed in the first region RE1 of the substrate 20. The first active region AC1a may have the first width x1, and may be formed in the upper surface 20a of the substrate 20 to the first depth y1.

The second active region AC1b-2 may be formed in the second region RE2 of the substrate 20 and may have a second width x2a equal to the first width x1 of the first active region AC1a. Here, the second active region AC1b-2 may be formed in the upper surface 20a of the substrate 20 to the second depth y2.

The third active region AC1c-2 may be formed in the third region RE3 of the substrate 20 and may have a third width x3a equal to the second width x2a of the second active region AC1b-2. The third active region AC1c-2 may be formed from in the upper surface 20a of the substrate 20 to the third depth y3.

Accordingly, in the integrated circuit device 10-2, although respective sizes of first to third contact plugs 34, 36, and 38 are different, the first to third depths y1, y2, and y3 of the first to third active regions AC1a, AC1b-2, and AC1c-2 or dopant concentrations of the first to third contact plugs 34, 36, and 38 may be well controlled. Therefore, the electrical performance and overall reliability of the integrated circuit device 10-2 may be improved by reducing resistance (e.g., contact resistance) distributions of the first to third contact plugs 34, 36, and 38.

Figure 4:
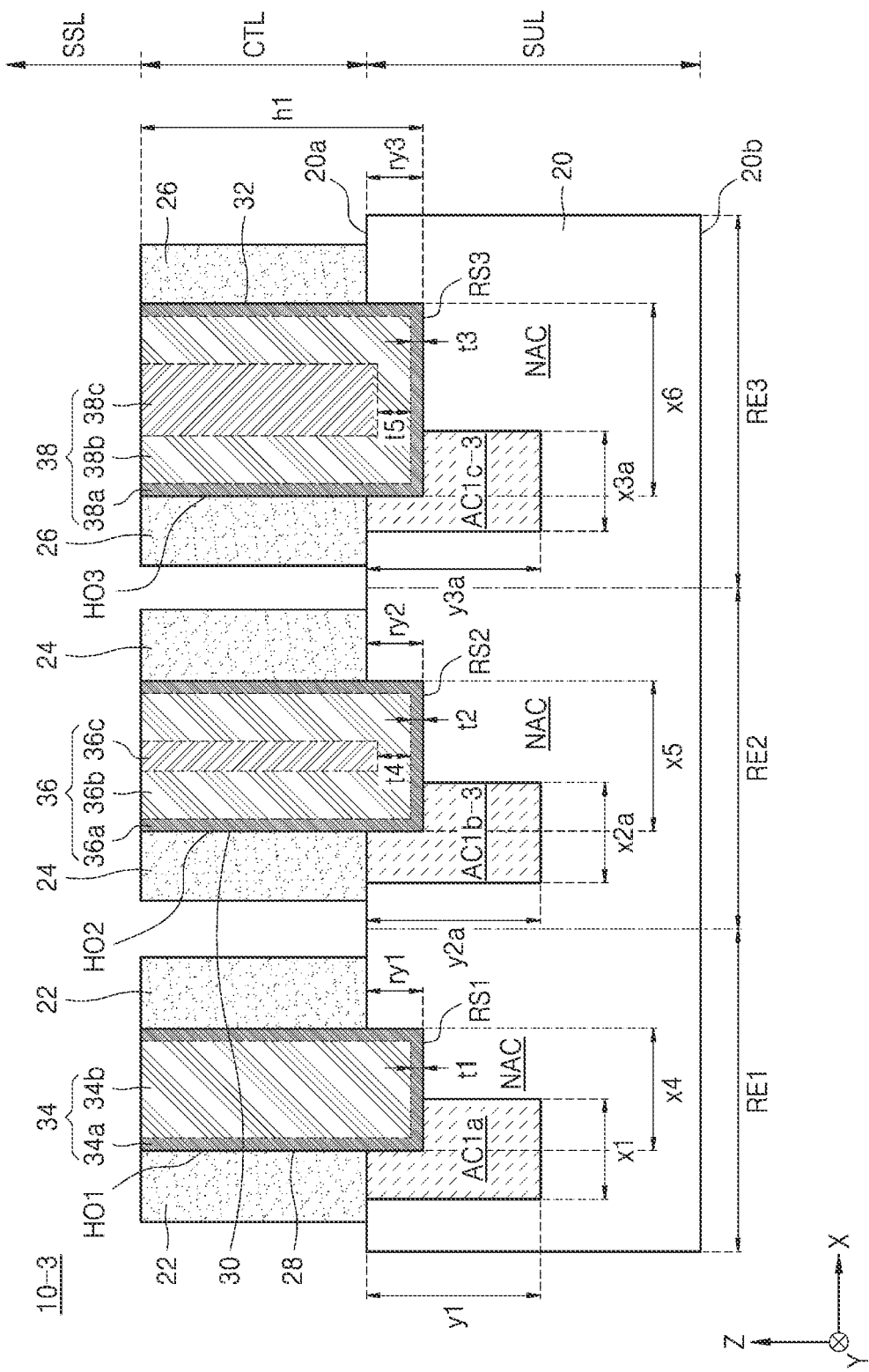

FIG. 4 is a cross-sectional view of an integrated circuit device 10-3 according to embodiments of the inventive concept. Here, the integrated circuit device 10-3 may be substantially the same as the integrated circuit device 10 of FIG. 1, except that respective sizes of first to third widths x1, x2a, and x3a and respective sizes of the depths y1, y2a, and y3a of first to third active regions AC1a, AC1b-3, and AC1c-3 are equal.

The integrated circuit device 10-3 may again include the first to third active regions AC1a, AC1b-3, and AC1c-3 spaced apart in the substrate 20. The first active region AC1a may be formed in the first region RE1 of the substrate 20. The first active region AC1a may have the first width x1 and may be formed in the upper surface 20a of the substrate 20 to the first depth y1.

The second active region AC1b-3 may be formed in the second region RE2 of the substrate 20. The second active region AC1b-3 may have the second width x2a equal to the first width x1. The second active region AC1b-3 may be formed in the upper surface 20a of the substrate 20 to a second depth y2a equal to the first depth y1 of the first active region AC1a.

The third active region AC1c-3 may be formed in the third region RE3 of the substrate 20. The third active region AC1c-3 may have a third width x3a equal to the second width x2a. The third active region AC1c-3 may be formed in the upper surface 20a of the substrate 20 to a third depth y3a equal to the second depth y2a of the second active region AC1b-3.

Accordingly, in the integrated circuit device 10-3, although respective sizes of first to third contact plugs 34, 36, and 38 are different, dopant concentrations of the first to third contact plugs 34, 36, and 38 may be well controlled. Therefore, the electrical performance and overall reliability of the integrated circuit device 10-3 may be improved by reducing resistance (e.g., contact resistance) distributions of the first to third contact plugs 34, 36, and 38.

Figure 5:
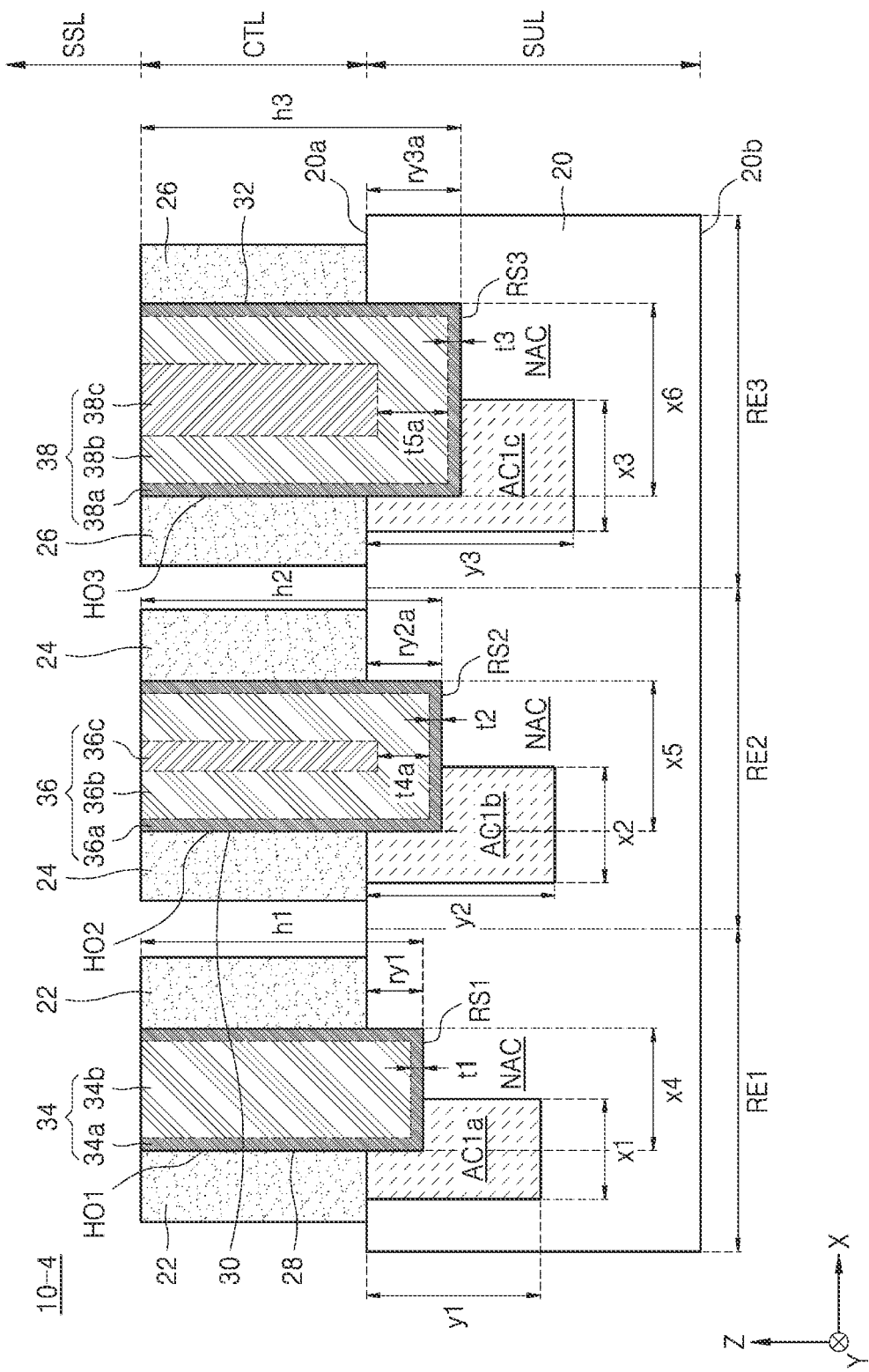

FIG. 5 is a cross-sectional view of an integrated circuit device 10-4 according to embodiments of the inventive concept. Here, the integrated circuit device 10-4 may be substantially the same as the integrated circuit device 10 of FIG. 1, except that first to third recess depths ry1, ry2a, and ry3a into the upper surface 20a of a substrate 20 are different.

In the integrated circuit device 10-4, in the first region RE1 of the substrate 20, the first recessed portion RS1 may be formed in the upper surface 20a of the substrate 20 to the first recess depth ry1 on one side of a first active region AC1a. The first recessed portion RS1 may be obtained by etching the upper surface 20a of the substrate 20 to the first recess depth ry1. In some embodiments, the first recess depth ry1 may range from about several nms to about tens of nms. Hence, the first contact plug 34 of a first region RE1 may have a first height h1.

In the integrated circuit device 10-4, in the second region RE2 of the substrate 20, a second recessed portion RS2 may be formed in the upper surface 20a of the substrate 20 to a second recess depth ry2a on one side of a second active region AC1b. Here, however, the second recess depth ry2a may be greater than the first recess depth ry1. A second semiconductor layer 36b—a constituent part of the second contact plug 36—may therefore have a fourth thickness t4a, and the second contact plug 36 may have a second height h2 greater than the first height h1 of the first contact plug 34.

In a third region RE3 of the substrate 20, a third recessed portion RS3 may be formed in the upper surface 20a of the substrate 20 to a third recess depth ry3a on one side of a third active region AC1c. Here, the third recess depth ry3a may be greater than the second recess depth ry2a of the second region RE2. A fourth semiconductor layer 38b—a constituent part of the third contact plug 38—may have a fifth thickness t5a, and the third contact plug 38 may have a third height h3 greater than the second height h2 of the second contact plug 36.

Accordingly, the integrated circuit device 10-4, although the respective sizes of the first to third contact plugs 34, 36, and 38 are different, dopant concentrations of the first to third contact plugs 34, 36, and 38 may be well controlled by controlling the respective first to third recess depths ry1, ry2a, and ry3a, and the first to third heights h1, h2, and h3 of the first to third contact plugs 34, 36, and 38. Therefore, the electrical performance and overall reliability of the integrated circuit device 10-4 may be improved by reducing resistance (e.g., contact resistance) distributions of the first to third contact plugs 34, 36, and 38.

Figure 6:
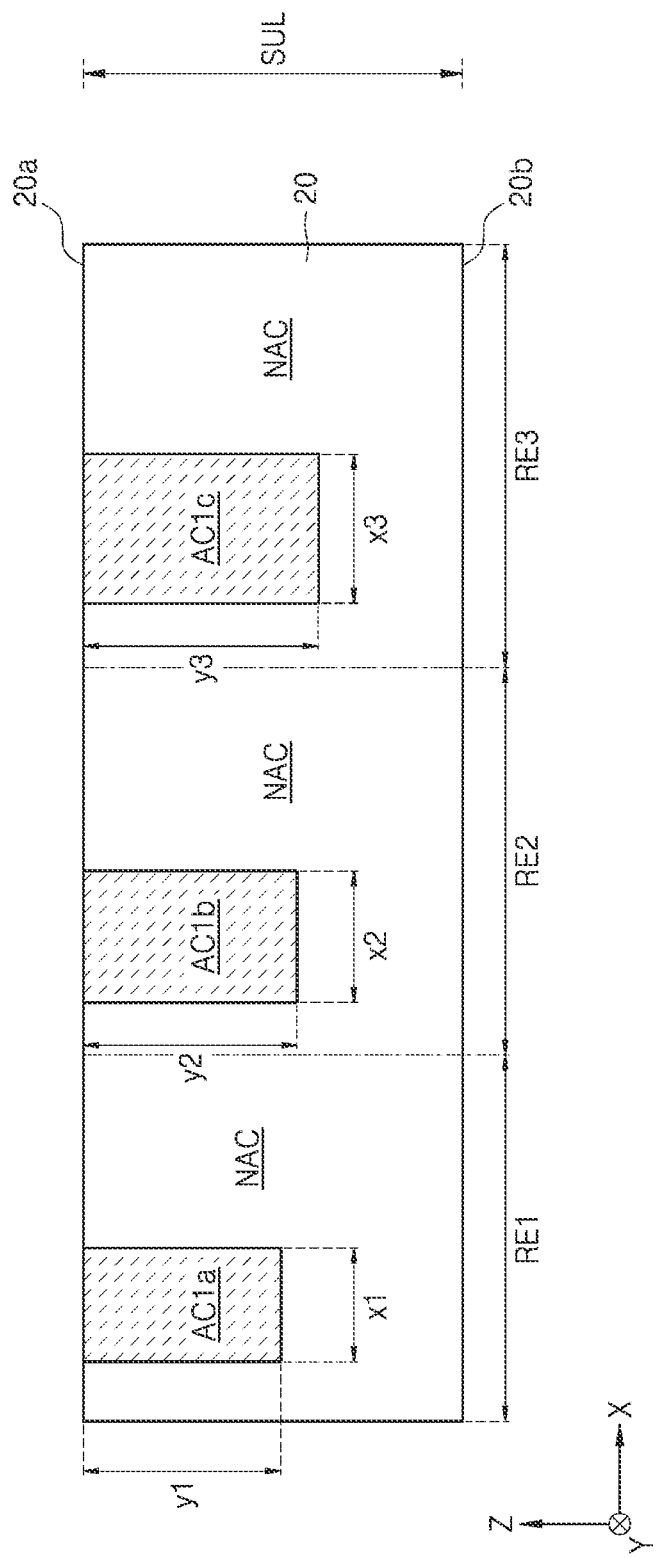
FIGS. 6, 7 and 8 are related, cross-sectional views illustrating in one example a method of manufacturing an integrated circuit device according to embodiments of the inventive concept.
Figure 7:
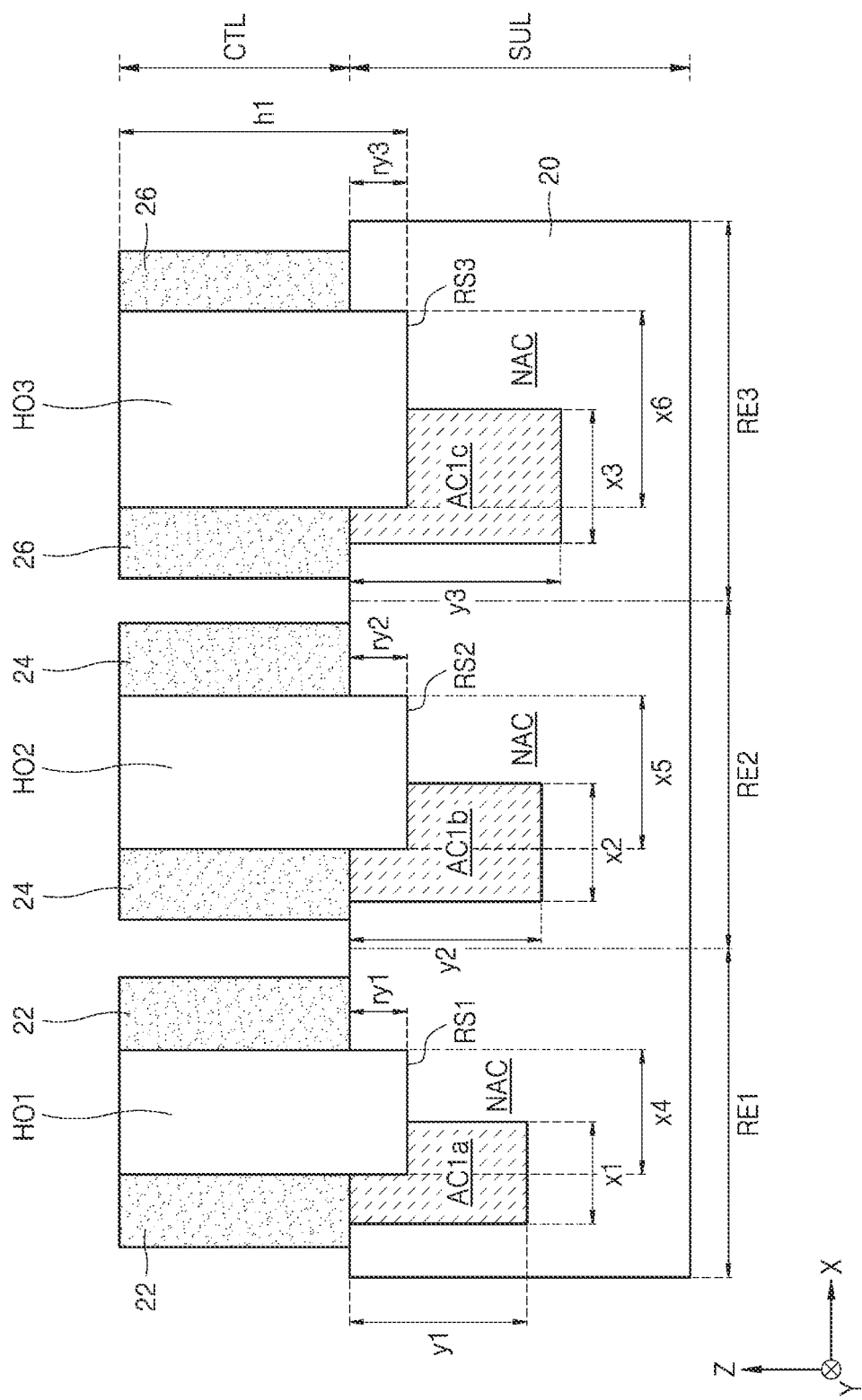
Figure 8:
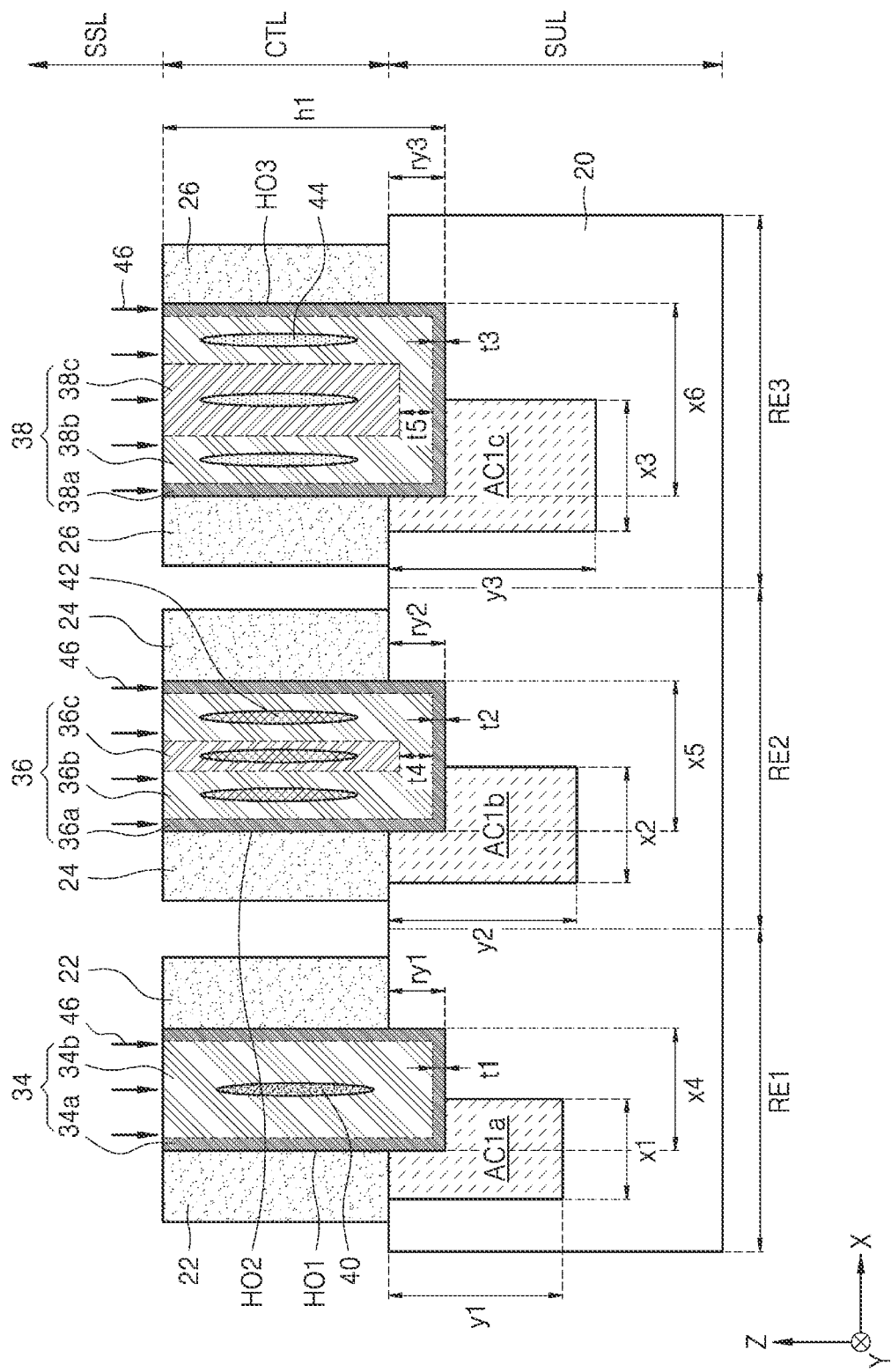

FIGS. 6, 7 and 8 are related, cross-sectional views illustrating in one example a method of manufacturing an integrated circuit device according to embodiments of the inventive concept. The method of FIGS. 6, 7 and 8 will be described in the context of the integrated circuit device 10 of FIG. 1.

Referring to FIG. 6, the substrate 20 (e.g., a silicon substrate) is prepared with the upper surface 20a and the lower (or rear) surface 20b. The first active region AC1a is formed with a first width x1 in the first region RE1, the second active region AC1b is formed with a second width x2 in the second region RE2, and the third active region AC1c is formed with a third width in the third region RE3 of the substrate 20. In this regard, the first active region AC1a, the second active region AC1b, and the third active region AC1c may be defined within the inactive region NAC (e.g., a field insulating layer) in the substrate 20.

Further the first active region AC1a, the second active region AC1b, and the third active region AC1c may be respectively formed with the first depth y1, the second depth y2, and the third depth y3 in the upper surface 20a of the substrate 20. The first to third active regions AC1a, AC1b, and AC1c may be configured as the substrate level SUL.

Referring to FIG. 7, the first semiconductor structure 22 may be formed on the first active region AC1a of the first region RE1 and the substrate 20. The second semiconductor structure 24 may be formed on the second active region AC1b of the second region RE2 and the substrate 20, and the third semiconductor structure 26 may be formed on the third active region AC1c of the third region RE3 and the substrate 20.

In some embodiments, the first semiconductor structure 22, the second semiconductor structure 24, and the third semiconductor structure 26 may be simultaneously formed. The first to third semiconductor structures 22, 24, and 26 may respectively include the first to third bit line structures.

On the first active region AC1a of the first region RE1 and the substrate 20, the first contact hole HO1 exposing the first active region AC1a may be formed in the first semiconductor structure 22. The aspect ratio of the first contact hole HO1 may be no less than 10. When the first contact hole HO1 is formed, on one side of the first active region AC1a, the first recessed portion RS1 recessed from the surface 20a of the substrate 20 with the first recess depth ry1 is formed. The first recessed portion RS1 may be obtained by etching the substrate 20 from the surface 20a of the substrate 20 with the first recess depth ry1. In some embodiments, the first recess depth ry1 may range from about several nms to about tens of nms.

On the second active region AC1b of the second region RE2 and the substrate 20, the second contact hole HO2 exposing the second active region AC1b may be formed in the second semiconductor structure 24. The aspect ratio of the second contact hole HO2 may be no less than 10. When the second contact hole HO2 is formed, on one side of the second active region AC1b, the second recessed portion RS2 recessed from the surface 20a of the substrate 20 with the second recess depth ry2 is formed. The second recessed portion RS2 may be obtained by etching the substrate 20 from the surface 20a of the substrate 20 with the second recess depth ry2. The second recess depth ry2 may be equal to the first recess depth ry1 of the first recessed portion RS1.

On the third active region AC1c of the third region RE3 and the substrate 20, the third contact hole HO3 exposing the third active region AC1c may be formed in the third semiconductor structure 26. The aspect ratio of the third contact hole HO3 may be no less than 10. When the third contact hole HO3 is formed, on one side of the third active region AC1c, the third recessed portion RS3 recessed from the surface 20a of the substrate 20 with the third recess depth ry3 is formed. The third recessed portion RS3 may be obtained by etching the substrate 20 from the surface 20a of the substrate 20 with the third recess depth ry3. The third recess depth ry3 may be equal to the second recess depth ry2 of the second recessed portion RS2.

In some embodiments, the first contact hole HO1, the second contact hole HO2, and the third contact hole HO3 may be simultaneously formed. Each of the first contact hole HO1, the second contact hole HO2, and the third contact hole HO3 may have the first height h1. The first contact hole HO1, the second contact hole HO2, and the third contact hole HO3 may be configured as the contact level CTL. The first recessed portion RS1, the second recessed portion RS2, and the third recessed portion RS3 may be simultaneously formed.

Referring to FIG. 8, the first seed layer 34a may be deposited in the first hole HO1 of the first region RE1. On the first seed layer 34a of the first region RE1, the first semiconductor layer 34b may then be deposited to bury the first contact hole HO1. The first seed layer 34a and the first semiconductor layer 34b may include doped silicon layer(s).

The first semiconductor layer 34b includes a single doped layer, hence first semiconductor layer 34b may have the first dopant concentration. The combination of the first seed layer 34a and the first semiconductor layer 34b may form the first contact plug 34, wherein the first contact plug 34 has the first dopant concentration.

Alternately, in some embodiments, the first semiconductor layer 34b are not completely buried in the first contact hole HO1, whereby a void and/or a seam 40 may be formed. By applying thermal energy (using e.g., a laser 46) to the first semiconductor layer 34b at least several nms of the first semiconductor layer 34b may be entirely or partially annealed. Here, for example, the laser 46 may be a pulse-type laser having a wavelength ranging in the hundreds of nms and selectively applied to only portions of the first semiconductor layer 34b.

Thus, as illustrated in FIG. 1, any void and/or seam 40 initially included in the first semiconductor layer 34b may be removed to form a holistic semiconductor layer. Therefore, the first contact plug 34 may include a holistic semiconductor layer.

Referring to FIG. 8, the second seed layer 36a may be deposited in the second contact hole HO2 of the second region RE2. On the second seed layer 36a of the second region RE2, the second semiconductor layer 36b and the third semiconductor layer 36c are deposited to bury the second contact hole HO2. The second seed layer 36a, the second semiconductor layer 36b, and the third semiconductor layer 36c may include doped semiconductor layer(s).

The second semiconductor layer 36b may have the first dopant concentration equal to that of the first semiconductor layer 34b of the first contact plug 34. The third semiconductor layer 36c may have the second dopant concentration less than the first dopant concentration. Thus, the second seed layer 36a, the second semiconductor layer 36b, and the third semiconductor layer 36c may be used to form the second contact plug 36. The second contact plug 36 may have the second dopant concentration less than the first dopant concentration. The sum of the first dopant concentration of the second semiconductor layer 36b and the second dopant concentration of the third semiconductor layer 36c may be the second dopant concentration of the second contact plug 36.

Alternately, the second semiconductor layer 36b and the third semiconductor layer 36c may not be completely buried in the second contact hole HO2, whereby voids and/or seams 42 may be formed. Here again, by selectively applying the laser 46 to the second semiconductor layer 36b and the third semiconductor layer 36c, the second semiconductor layer 36b and the third semiconductor layer 36c may be entirely or partially annealed. Here again, the laser 46 may be the pulse-type laser having the wavelength of hundreds of nms, and may be selectively applied to only portions of the second semiconductor layer 36b and the third semiconductor layer 36c.

Thus, as illustrated in FIG. 1, any voids and/or seams 42 included in the second semiconductor layer 36b and the third semiconductor layer 36c may be removed, and the second contact plug 36 may include a holistic semiconductor layer.

Referring to FIG. 8, the third seed layer 38a may be deposited in the third contact hole HO3 of the third region RE3. On the third seed layer 38a of the third region RE3, the fourth semiconductor layer 38b and the fifth semiconductor layer 38c are deposited to bury the third contact hole HO3. The third seed layer 38a, the fourth semiconductor layer 38b, and the fifth semiconductor layer 38c may include doped semiconductor layers.

The fourth semiconductor layer 38b may have the first dopant concentration equal to that of the first semiconductor layer 34b of the first contact plug 34. The fifth semiconductor layer 38c may have the third dopant concentration that is less than the first dopant concentration and the second dopant concentration of the third semiconductor layer 36c. The third seed layer 38a, the fourth semiconductor layer 38b, and the fifth semiconductor layer 38c may be used to form the third contact plug 38. Here, the third contact plug 38 may have the third dopant concentration less than the second dopant concentration of the second contact plug 36. The sum of the first dopant concentration of the fourth semiconductor layer 38b and the third dopant concentration of the fifth semiconductor layer 38c may be the third dopant concentration of the third contact plug 38.

In some embodiments, the first seed layer 34a, the second seed layer 36a, and the third seed layer 38a may be simultaneously formed. For example, the first semiconductor layer 34b, the second semiconductor layer 36b, and the fourth semiconductor layer 38b may be simultaneously formed using a photolithography process, and the third semiconductor layer 36c and the fifth semiconductor layer 38c may be simultaneously formed using a photolithography process.

Alternately, the fourth semiconductor layer 38b and the fifth semiconductor layer 38c may not be completely buried in the third contact hole HO3 so that voids and/or seams 44 may be formed. Here again, by selectively applying the laser 46 to the fourth semiconductor layer 38b and the fifth semiconductor layer 38c, the fourth semiconductor layer 38b and the fifth semiconductor layer 38c may be entirely or partially annealed. As before, the laser 46 may be the pulse-type laser having the wavelength of hundreds of nms, and may be selectively applied to only portions of the fourth semiconductor layer 38b and the fifth semiconductor layer 38c.

Thus, as illustrated in FIG. 1, any voids and/or seams 44 included in the fourth semiconductor layer 38b and the fifth semiconductor layer 38c may be removed. Therefore, the third contact plug 38 may include a holistic semiconductor layer.

Figure 9:
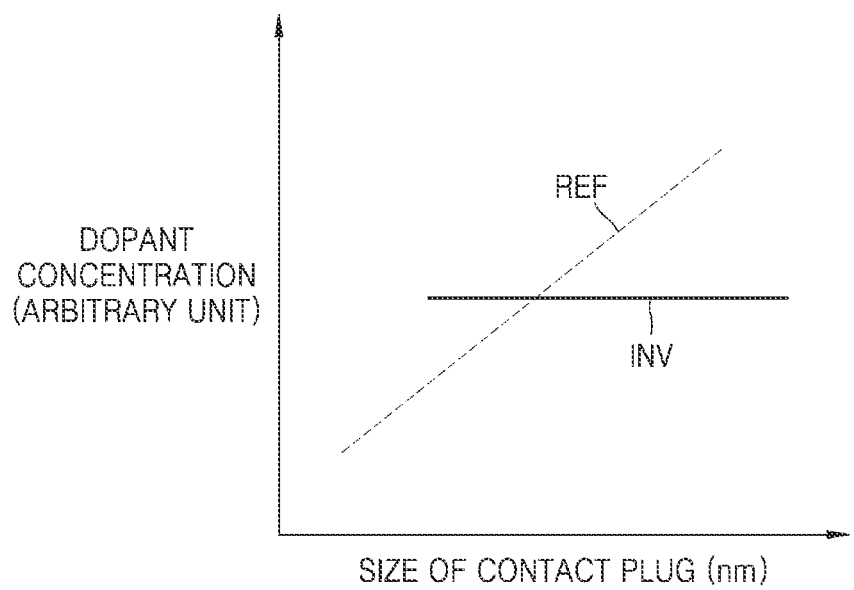
FIG. 9 is a graph illustrating dopant concentration as a function of contact plug size in integrated circuit devices according to embodiments of the inventive concept.

FIG. 9 is a graph illustrating dopant concentration as a function of sizes of contact plugs for integrated circuit devices according to embodiments of the inventive concept.

In particular, the dopant concentrations (INV) of the first to third contact plugs 34, 36, and 38 of the integrated circuit devices described in relation to FIGS. 1 to 5 are very well controlled (e.g., are uniform), despite the variations in size(s) of the first to third contact plugs 34, 36, and 38. This result compares most favorably with the uncontrolled dopant concentrations (REF) for comparative contact plugs of varying size in conventional integrated circuit devices. Accordingly, when dopant concentrations of the first to third contact plugs 34, 36, and 38 are well controlled, the contact resistance distributions for the first to third contact plugs 34, 36, and 38 may be reduced. As a result, the electrical performance or overall reliability of integrated circuit devices according to embodiments of the inventive concept may be improved.

In great contrast, the uncontrolled dopant concentrations of contact plugs in conventional integrated circuit devices tend to increase as the size(s) of the contact plugs increase. Thus, the corresponding resistance (e.g., contact resistance) distributions for the comparative contact plugs tend to increase, and as a result, electrical performance or overall reliability of the conventional integrated circuit devices deteriorate.

Figure 10:
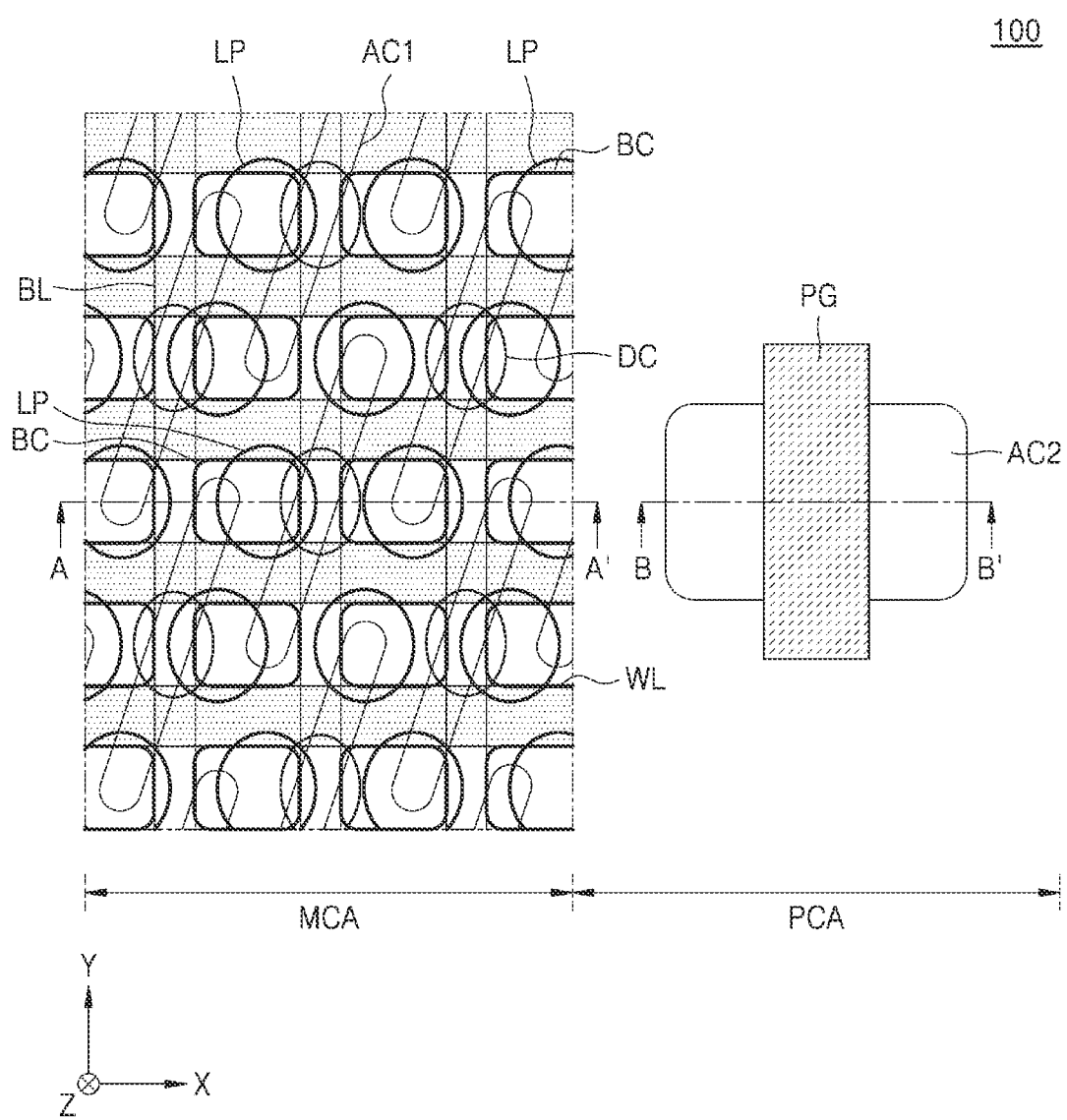
FIG. 10 is a layout (or top-down) view illustrating an integrated circuit device according to embodiments of the inventive concept.
Figure 11:
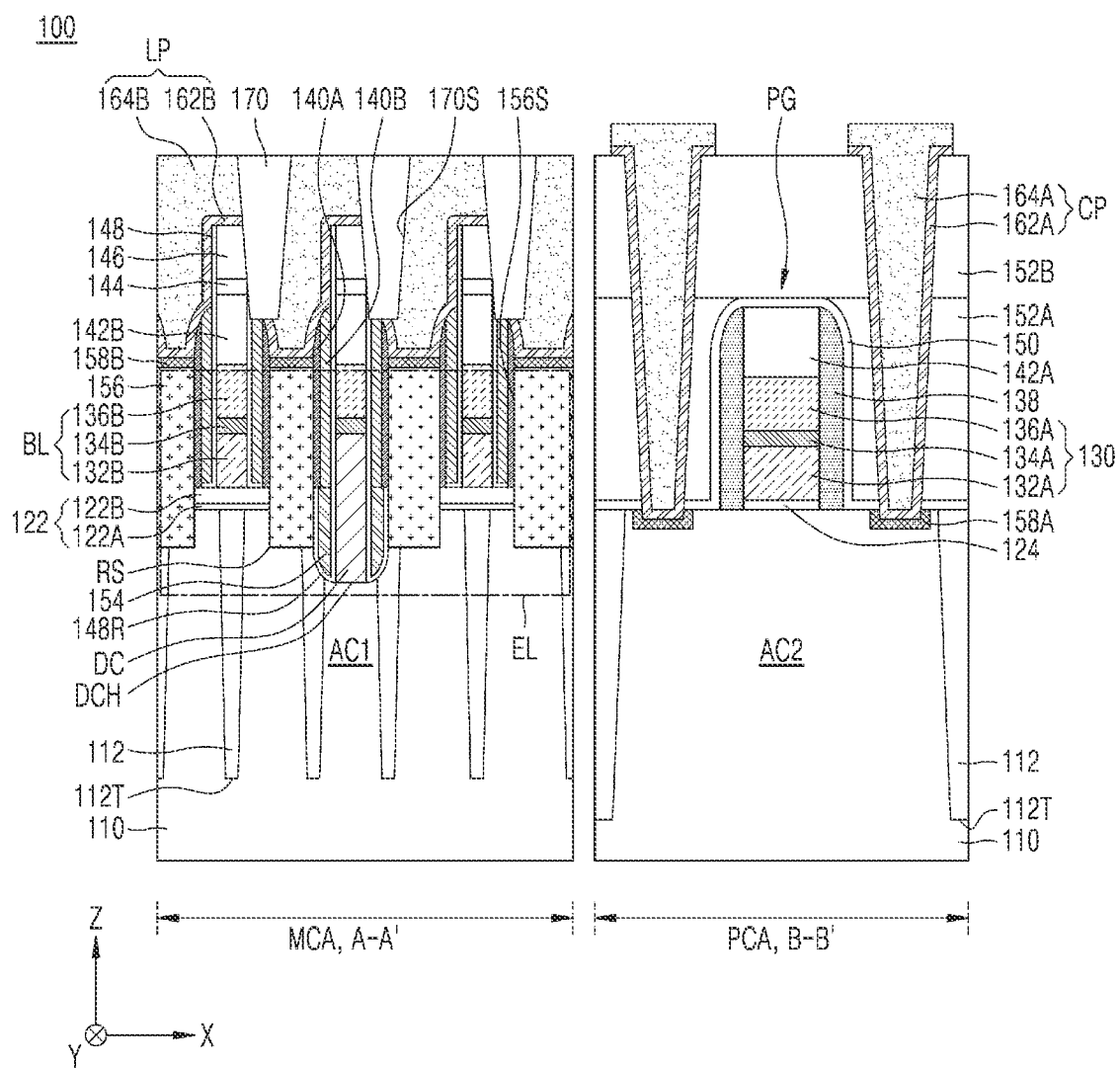
FIG. 11 is a cross-sectional view of a main portion taken along the lines A-A' and B-B' of FIG. 10.
Figure 12:
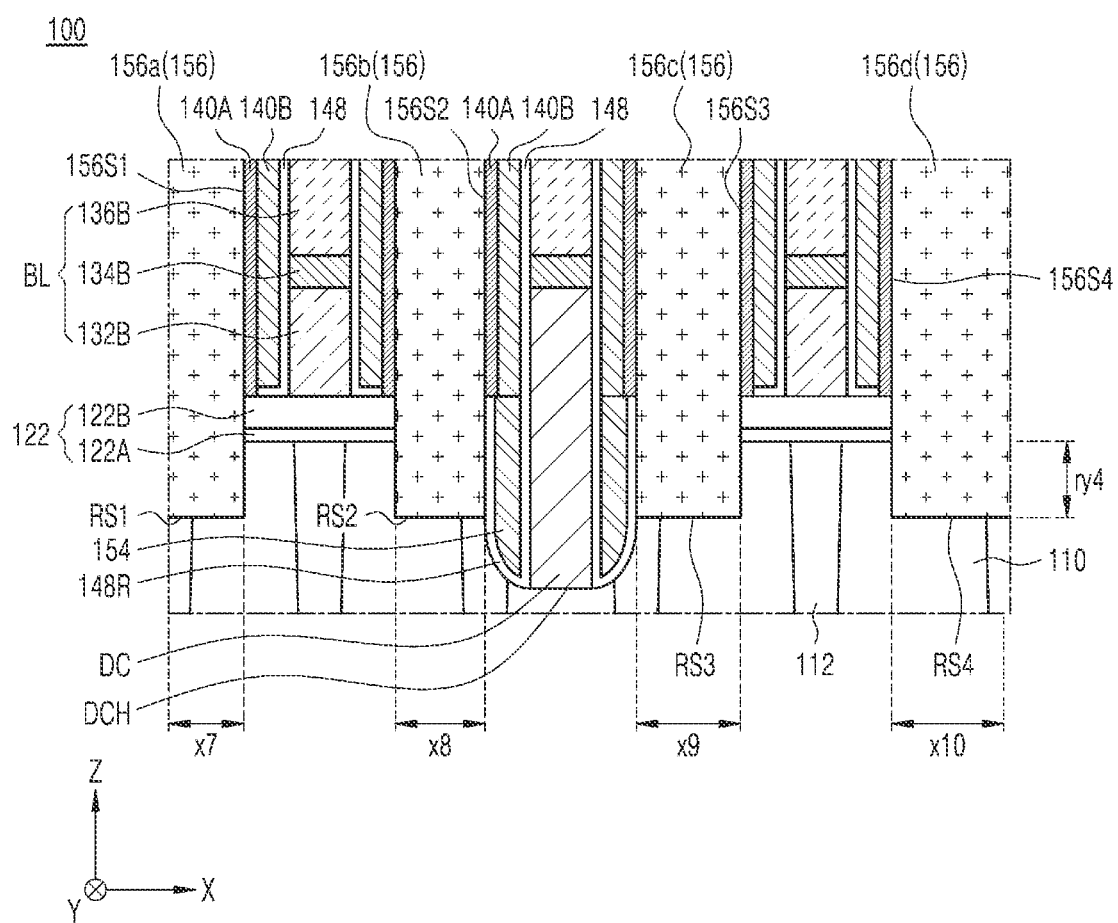
FIG. 12 is an enlarged view of the region "EL" indicated in FIG. 11.

FIG. 10 is a layout diagram illustrating an integrated circuit device 100 according to embodiments of the inventive concept, FIG. 11 is a cross-sectional view of a main portion taken along the lines A-A' and B-B' of FIG. 10, and FIG. 12 is an enlarged cross-sectional view further illustrating the region "EL" of FIG. 11.

Here, the integrated circuit device 100 (e.g., a dynamic random access memory (DRAM) device), may include a cell array region MCA. Description previously given to the integrated circuit devices 10, 10-1, 10-2, 10-3, and 10-4 of FIGS. 1 to 5 may be applied to the cell array region MCA of the integrated circuit device 100.

The integrated circuit device 100 may be implemented in a substrate 110. The substrate 110 may correspond to the substrate 20 of FIGS. 1 to 5. Isolation trenches 112T may be formed in the substrate 110. Isolation layers 112 may be formed in the isolation trenches 112T. A cell active region AC1 may be defined by the isolation layers 112 in the substrate 110 in the cell array region MCA and a peripheral circuit active region AC2 may be defined in the substrate 110 in a peripheral circuit region PCA.

The cell active region AC1 may correspond to the first to third active regions AC1a, AC1b, AC1b-1, AC1b-2, AC1b-3, AC1c, AC1c-1, AC1c-2, and AC1c-3 of FIGS. 1 to 5. The isolation layers 112 formed in the isolation trenches 112T may correspond to the inactive region NAC of FIGS. 1 to 5.

The cell active region AC1 may have a long axis in a diagonal direction with respect to the first direction and the second direction. Word lines WL may extend in parallel in the first direction across the cell active region AC1. On the word lines WL, bit lines BL may extend in parallel in the second direction. The bit lines BL may be connected to the cell active region AC1 through a direct contact DC.

Between two adjacent bit lines BL among the bit lines BL, a buried contact BC may be formed. The buried contacts BC may be arranged in line in the first direction and the second direction. Landing pads LP may be formed on the buried contacts BC. The buried contacts BC and the landing pads LP connect lower electrodes (not shown) of capacitors formed on the bit lines BL to the cell active region AC1. The landing pads LP may partially overlap the buried contacts BC.

In some embodiments, the substrate 110 may include silicon, for example, monocrystalline silicon, polycrystalline silicon, or amorphous silicon. In some embodiments, the substrate 110 may include at least one selected from germanium (Ge), silicon germanium (SiGe), silicon carbide (SiC), gallium arsenide (GaAs), indium arsenide (InAs), and indium phosphide (InP). In some embodiments, the substrate 110 may include a conductive region, for example, a well doped with impurities or a structure doped with impurities. The isolation layers 112 may include an oxide layer, a nitride layer, or a combination of the above layers.

In the cell array region MCA, word line trenches (not shown) extending in the first direction are formed in the substrate 110 and gate dielectric layers (not shown), word lines (not shown), and capping insulation layers (not shown) are formed in the respective word line trenches. The word lines may correspond to the word lines WL illustrated in FIG. 10.

In the cell array region MCA, a buffer layer 122 may be formed on the substrate 110. The buffer layer 122 may include a first insulating layer 122A and a second insulating layer 122B. The first insulating layer 122A and the second insulating layer 122B may include an oxide layer, a nitride layer, or a combination of the above layers. The direct contact DC may be formed in a direct contact hole (DCH) in the substrate 110. The direct contact DC may be connected to the cell active region AC1. The direct contact DC may include Si, Ge, tungsten (W), tungsten nitride (WN), cobalt (Co), nitrogen (Ni), aluminum (Al), molybdenum (Mo), ruthenium (Ru), titanium (Ti), titanium nitride (TiN), tantalum (Ta), tantalum nitride (TaN), copper (Cu), or a combination of the above materials.

On the substrate 110 and the direct contact DC, a bit line BL may longitudinally extend in the second direction (the Y direction). The bit line BL may be connected to the cell active region AC1 through the direct contact DC. The bit line BL may include a lower conductive pattern 132B, an intermediate conductive pattern 134B, and an upper conductive pattern 136B sequentially stacked on the substrate 110.

The lower conductive pattern 132B may include doped polysilicon. The intermediate conductive pattern 134B and the upper conductive pattern 136B may include TiN, TiSiN, W, tungsten silicide, or a combination of the above materials. In some embodiments, the intermediate conductive pattern 134B may include TiN, TiSiN, or a combination of the above materials and the upper conductive pattern 136B may include W.

The bit line BL may be covered with an insulation capping layer. The insulation capping layer may include a lower capping pattern 142B, an insulating layer pattern 144, and an upper capping pattern 146. Each of the lower capping pattern 142B, the insulating layer pattern 144, and the upper capping pattern 146 may include a silicon nitride layer. The lower capping pattern 142B, the insulating layer pattern 144, and the upper capping pattern 146 may be sequentially stacked on the bit line BL.

On both side walls or one side wall of each of the bit line BL and the lower capping pattern 142B, the insulating layer pattern 144, and the upper capping pattern 146, insulation liners 148, first spacers 140B, and second spacers 140A may be formed. The insulation liners 148, the first spacers 140B, and the second spacers 140A may configure multiple spacers.

Each of the insulation liners 148, the first spacers 140B, and the second spacers 140A may include a silicon oxide layer, a silicon nitride layer, or a silicon oxynitride layer. The bit lines BL, the lower capping pattern 142B, the insulating layer pattern 144, the upper capping pattern 146, the insulation liners 148, the first spacers 140B, and the second spacers 140A may configure a bit line structure. The bit line structure may correspond to the first to third semiconductor structures 22, 24, and 26 of FIGS. 1 to 5.

The direct contact DC is formed in the direct contact hole DCH formed in the substrate 110 and may extend to a level higher than a surface of the substrate 110. A lower side of the direct contact DC may be surrounded by an insulation liner 148R, and a direct contact spacer 154 and an upper side of the direct contact DC may be surrounded by an insulating layer 170.

Contact plugs 156 and insulation fences (not shown) may be arranged in line among the bit lines BL in the second direction. The insulation fences will be described hereafter in some additional detail. The contact plugs 156 may be respectively buried in contact holes 156S among bit line structures. The contact plugs 156 may longitudinally extend from recessed portions RS formed in the substrate 110 in the third direction. In some embodiments, the contact plugs 156 may be configured as the buried contacts BC of FIG. 10. The contact plugs 156 may be doped silicon (or doped polysilicon) plugs.

Contact holes 156S may correspond to the first to third contact holes HO1, HO2, and HO3 of FIGS. 1 to 5, and the contact plugs 156 may correspond to the first to third contact plugs 34, 36, and 38 of FIGS. 1 to 5. The recessed portions RS may correspond to the first to third recessed portions RS1, RS2, and RS3 of FIGS. 1 to 5.

For example, the contact plugs 156 may include a first contact plug 156a, a second contact plug 156b, a third contact plug 156c, and a fourth contact plug 156d. The first contact plug 156a may be buried in the first recessed portion RS1 and a first contact hole 156S1, and the second contact plug 156b may be buried in the second recessed portion RS2 and a second contact hole 156S2. The third contact plug 156c may be buried in the third recessed portion RS3 and a third contact hole 156S3, and the fourth contact plug 156d may be buried in the fourth recessed portion RS4 and a fourth contact hole 156S4.

The first contact plug 156a and the second contact plug 156b may respectively have a seventh width x7 and an eighth width x8 in the first direction. The third contact plug 156c and the fourth contact plug 156d may respectively have a ninth width x9 and a tenth width x10 in the first direction. In some embodiments, the seventh width x7, the eighth width x8, the ninth width x9, and the tenth width x10 may increase in order. In some embodiments, the first recessed portion RS1, the second recessed portion RS2, the third recessed portion RS3, and the fourth recessed portion RS4 may have a fourth recess depth ry4 from the surface of the substrate 110.

The first contact plug 156a, the second contact plug 156b, the third contact plug 156c, and the fourth contact plug 156d may respectively have a first dopant concentration, a second dopant concentration, a third dopant concentration, and a fourth dopant concentration. In some embodiments, the first dopant concentration, the second dopant concentration, the third dopant concentration, and the fourth dopant concentration may decrease in the order. Each of the first to fourth dopant concentrations may range from about $9E19/cm^3$ to about $1E20/cm^3$.

In some embodiments, the first to fourth contact plugs 156a, 156b, 156c, and 156d may be obtained by entirely or partially annealing doped semiconductor layers (e.g., doped silicon layers). Therefore, the first to fourth contact plugs 156a, 156b, 156c, and 156d may be formed from holistic doped semiconductor layers without voids and/or seams.

As described above, in the integrated circuit device 100, although the sizes of the contact plugs 156 are different, the dopant concentrations of the contact plugs 156 are well controlled. Therefore, electrical performance (e.g., a refresh characteristic for memory cells of the integrated circuit device 100) may improve due to reduced resistance (e.g., contact resistance) distributions for the contact plugs 156.

Metal silicide layers 158B and the landing pads LP may be formed on the contact plugs 156. The metal silicide layers 158B and the landing pads LP may vertically overlap the contact plugs 156. The metal silicide layers 158B may include Co silicide, Ni silicide, or manganese (Mg) silicide. The landing pads LP may be connected to the contact plugs 156 through the metal silicide layers 158B.

The landing pads LP may cover at least part of upper surfaces of the upper capping patterns 146 to vertically overlap parts of the bit lines BL. The landing pads LP may include conductive barrier layers 162B and landing pad conductive layers 164B. The conductive barrier layers 162B may include Ti, TiN, or a combination of the above materials. The landing pad conductive layers 164B may include a metal, metal nitride, conductive polysilicon, or a combination of the above materials. For example, the landing pad conductive layers 164B may include W. The landing pads LP may be shaped in island patterns.

The landing pads LP may be electrically isolated one from the other by the insulating layers 170 filling insulation spaces 170S. The insulating layers 170 may include $SiO_2$, SiOCH, SiOC, silicon nitride, or silicon oxynitride. The insulating layers 170 may include an insulating material that may fill the insulation spaces 170S by a spin coating process, a chemical vapor deposition (CVD) process, or a flowable CVD process.

The integrated circuit device 100 (e.g., a DRAM device) may include the peripheral circuit region PCA. A gate structure PG may be formed on the peripheral circuit active region AC2 of the peripheral circuit region PCA. The gate structure PG may be a peripheral word line of the peripheral circuit region PCA.

The gate structure PG may include a gate dielectric layer 124, a gate electrode 130, and a gate capping pattern 142A sequentially stacked on the peripheral circuit active region AC2. The gate dielectric layer 124 may include at least one selected from a silicon oxide layer, a silicon nitride layer, a silicon oxynitride layer, an oxide/nitride/oxide (ONO) layer, and a high-k dielectric layer having a dielectric constant higher than that of the silicon oxide layer.

The gate electrode 130 may include a lower conductive pattern 132A, an intermediate conductive pattern 134A, and an upper conductive pattern 136A. Constituent materials of the lower conductive pattern 132A, the intermediate conductive pattern 134A, and the upper conductive pattern 136A may be respectively the same as those of the lower conductive pattern 132B, the intermediate conductive pattern 134B, and the upper conductive pattern 136B included in the bit line BL in the cell array region MCA. The gate capping pattern 136A may include a silicon nitride layer.

Both side walls of the gate structure PG may be covered with insulation spacers 138. The insulation spacers 138 may include an oxide layer, a nitride layer, or a combination of the above layers. The gate structure PG and the insulation spacers 138 may be covered with a protective layer 150. The protective layer 150 may include a silicon nitride layer. On the protective layer 150, around the gate structure PG, an interlayer insulating layer 152A may be formed. The interlayer insulating layer 152A may include tonen silazene (TOSZ). However, the inventive concept is not limited thereto. The gate structure PG, the protective layer 150, and the interlayer insulating layer 152A may be covered with an upper insulation capping layer 152B. The upper insulation capping layer 152B may include a silicon nitride layer.

In the peripheral circuit region PCA, peripheral contact plugs CP passing through the upper insulation capping layer 152B, the interlayer insulating layer 152A, and the protective layer 150 in a vertical direction and extending to the peripheral circuit active region AC2 of the substrate 110 may be formed. The peripheral contact plugs CP may include conductive barrier layers 162A and landing pad conductive layers 164A, like the landing pads LP formed in the cell array region MCA, as well as metal silicide layers 158A between the peripheral circuit active region AC2 and the peripheral contact plugs CP. The metal silicide layers 158A may include Co silicide, Ni silicide, or Mg silicide.

FIGS. 13, 14, 15, 16, 17, 18, 19, 20 and 21 (hereafter collectively, FIGS. 13 to 21) are related cross-sectional views illustrating in one example a method of manufacturing an integrated circuit device according to embodiments of the inventive concept. Referring to FIGS. 13 to 21, the method of manufacturing the integrated circuit device 100 illustrated in FIGS. 10 to 12 will be further described.

Figure 13:
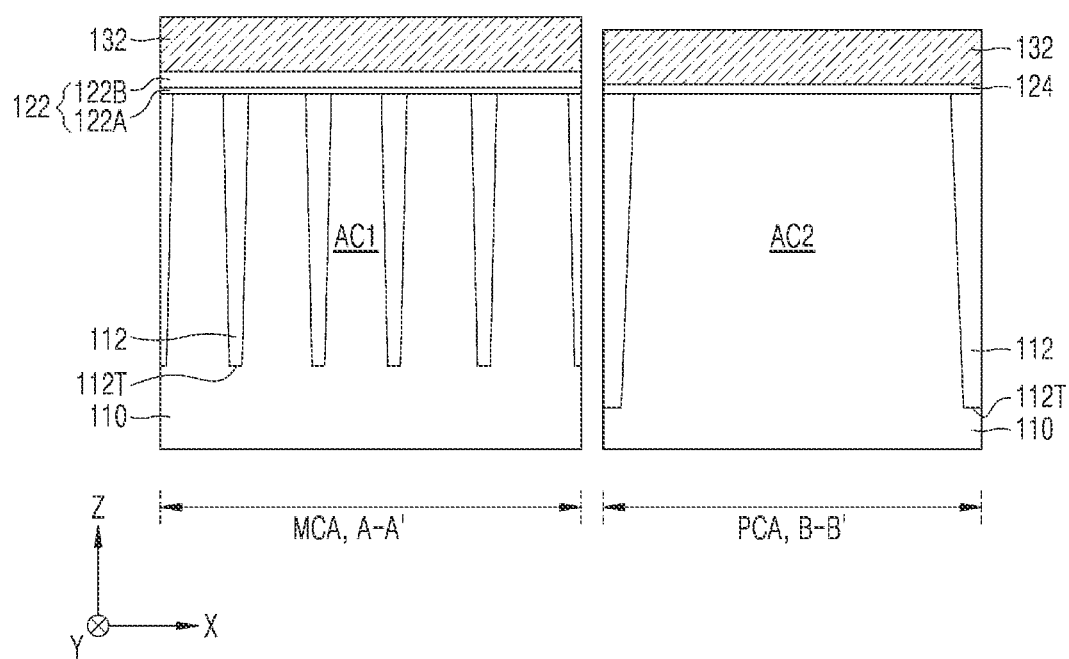
FIGS. 13, 14, 15, 16, 17, 18, 19, 20 and 21 are related, cross-sectional views illustrating in one example a method of manufacturing an integrated circuit device according to embodiments of the inventive concept.

Referring to FIG. 13, by forming the isolation trenches 112T and the isolation layers 112 in the substrate 110 having the cell array region MCA and the peripheral circuit region PCA, the cell active region AC1 is defined in the cell array region MCA of the substrate 110 and the peripheral circuit active region AC2 is defined in the peripheral circuit region PCA.

In the cell array region MCA, parallel word line trenches (not shown) may be formed in the substrate 110. In the word line trenches, the gate dielectric layers (not shown), the word lines (not shown), and the capping insulation layers (not shown) may be sequentially formed. In the cell active region AC1, by selectively implanting impurity ions into both sides of the word line WL, source/drain regions may be formed on the cell active region AC1.

In the cell array region MCA, the buffer layer 122 including the first insulating layer 122A and the second insulating layer 122B is formed on the substrate 110. In the peripheral circuit region PCA, the gate dielectric layer 124 may be formed on the substrate 110. Then, the lower conductive layer 132 may be formed on the buffer layer 122 of the cell array region MCA and the gate dielectric layer 124 of the peripheral circuit region PCA.

Figure 14:
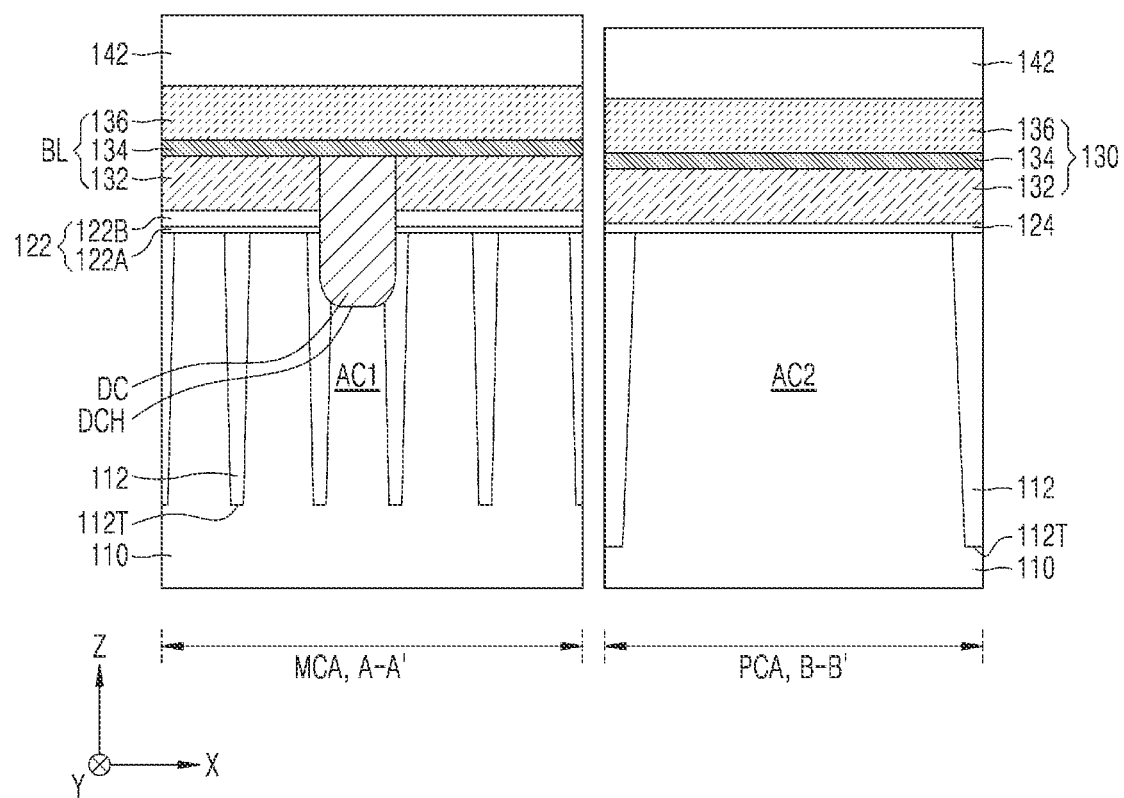

Referring to FIG. 14, after forming a first mask pattern (not shown) on the lower conductive layer 132, in the cell array region MCA, by etching the lower conductive layer 132 exposed through an opening (not shown) of the first mask pattern and etching parts of the substrate 110 and the isolation layers 112 exposed as a result of etching the lower conductive layer 132, the direct contact hole DCH exposing the cell active region AC1 of the substrate may be formed.

Then, the first mask pattern is removed and the direct contact DC is formed in the direct contact hole DCH. In an exemplary process for forming the direct contact DC, a conductive layer of a thickness enough to fill the direct contact hole DCH is formed in the direct contact hole DCH and on the lower conductive layer 132 and the conductive layer may be etched back so that the conductive layer remains only in the direct contact hole DCH. The conductive layer may include Si, Ge, W, WN, Co, Ni, Al, Mo, Ru, Ti, TiN, Ta, TaN, Cu, or a combination of the above materials.

Then, in the cell array region MCA and the peripheral circuit region PCA, the intermediate conductive layer 134, the upper conductive layer 136, and the lower capping layer 142 may be sequentially formed on the lower conductive layer 132 and the direct contact DC. The intermediate conductive layer 134 and the upper conductive layer 136 may include TiN, TiSiN, W, W silicide, or a combination of the above materials. The lower capping layer 142 may include a silicon nitride layer.

Figure 15:
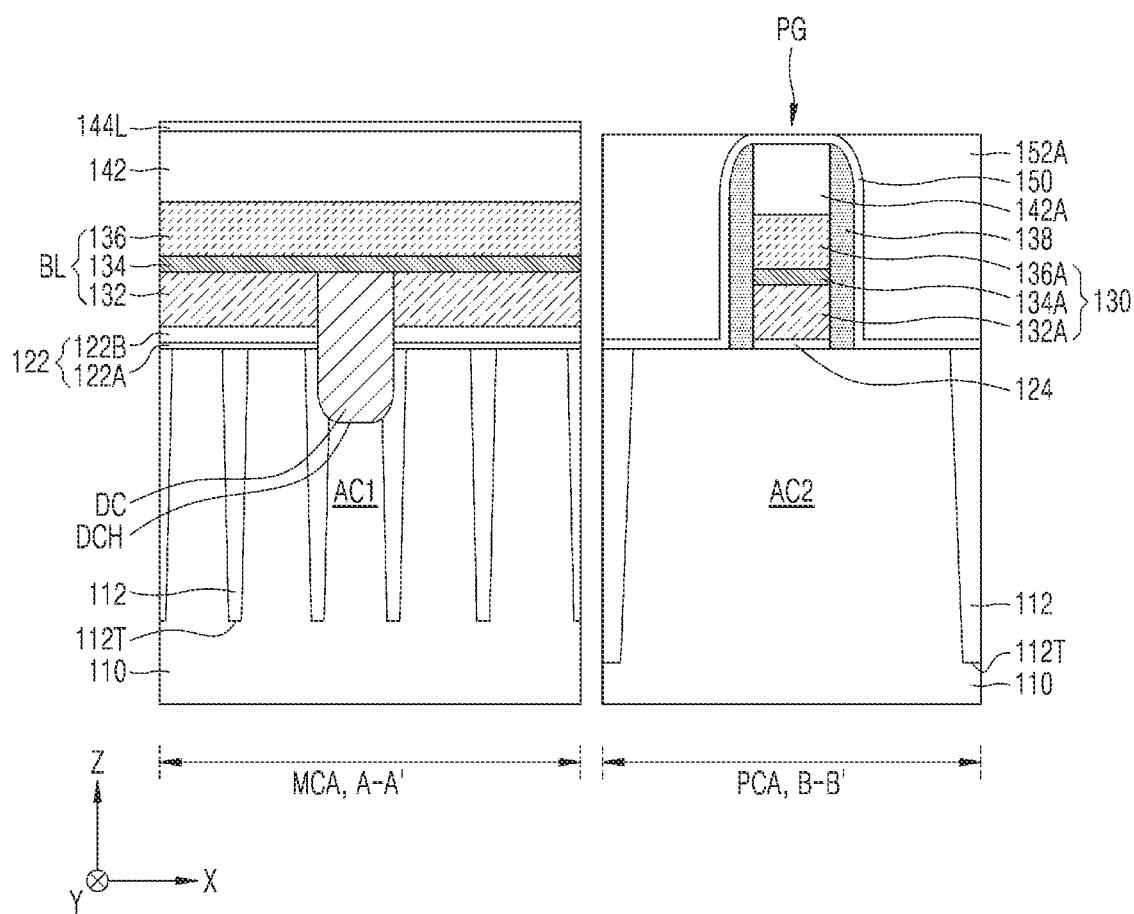

Referring to FIG. 15, by patterning the gate dielectric layer 124, the lower conductive layer 132, the intermediate conductive layer 134, the upper conductive layer 136, and the lower capping layer 142 in the peripheral circuit region PCA in a state in which the cell array region MCA is covered with a mask pattern (not shown), the gate electrode 130 including the lower conductive pattern 132A, the intermediate conductive pattern 134A, and the upper conductive pattern 136A and the gate capping pattern 136A covering the gate electrode 130 are formed on the gate dielectric layer 124.

Then, the insulation spacers 138 are formed on the both side walls of the gate structure PG having a stacked structure of the gate dielectric layer 124, the gate electrode 130, and the gate capping pattern 136A and an ion implantation process for forming the source/drain regions on both sides of the gate structure PG in the peripheral active region AC2 is performed.

Then, the lower capping layer 142 may be exposed in the cell array region MCA by removing the mask pattern covering the cell array region MCA, an insulating layer 144L may be formed on the lower capping layer 142 in the cell array region MCA, and the protective layer 150 covering the gate structure PG and the insulation spacers 138 in the peripheral circuit region PCA may be formed. Then, in the peripheral circuit region PCA, the interlayer insulating layer 152A filling a space around the gate structure PG is formed. The insulating layer 144L may be simultaneously formed with the protective layer 150 by using the same material. However, the inventive concept is not limited thereto.

Figure 16:
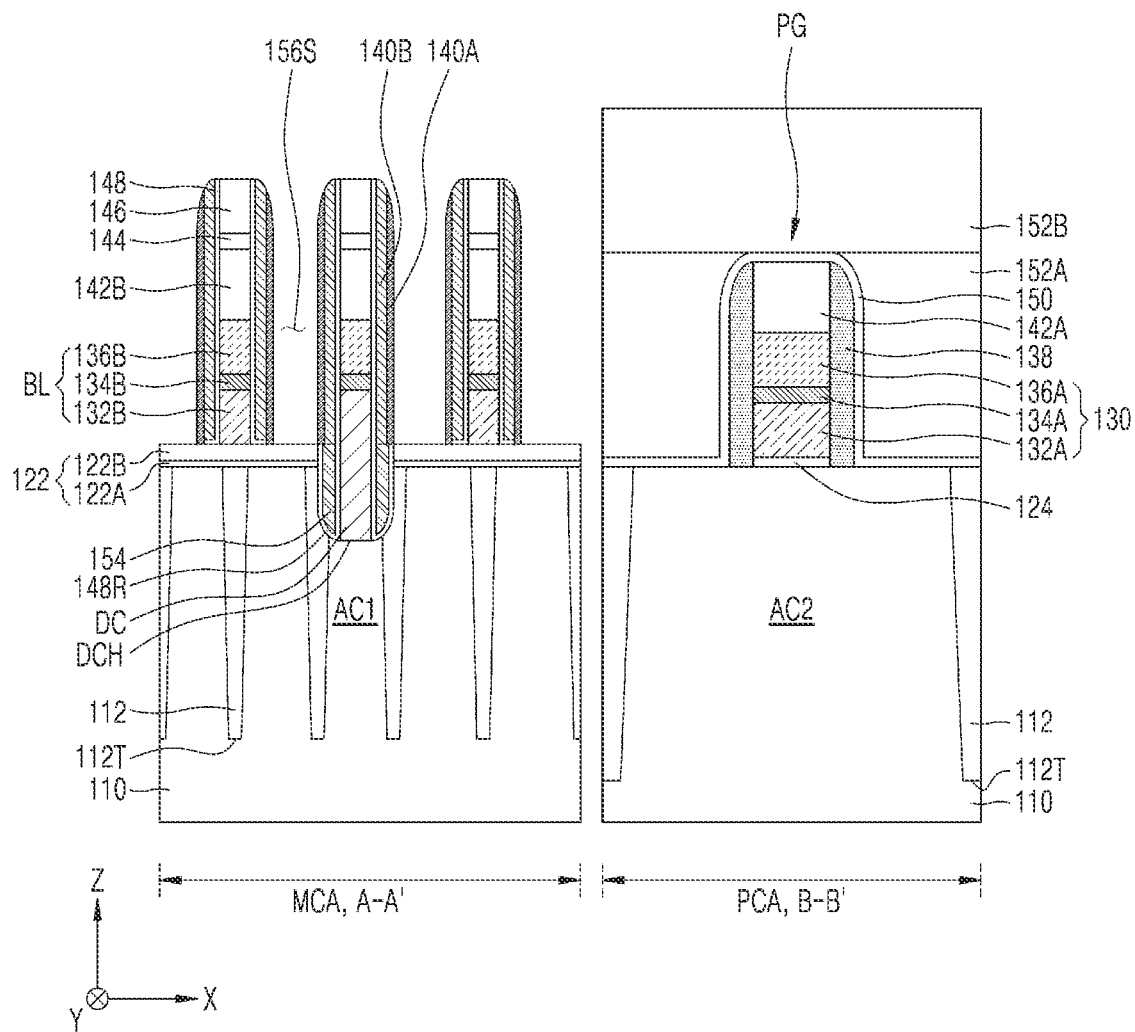

Referring to FIG. 16, in the peripheral circuit region PCA, the upper insulation capping layer 152B is formed on the protective layer 150 and the interlayer insulating layer 152A. Then, in the cell array region MCA, an upper capping layer (not shown) is formed on the insulating layer 144L.

Then, in the cell array region MCA, by patterning the upper capping layer, the insulating layer 144L, and the lower capping layer 142, the lower capping pattern 142B, the insulating layer pattern 144, and the upper capping pattern 146 sequentially stacked on the upper conductive layer 136 are formed.

Then, in the cell array region MCA, by etching the upper conductive layer 136, the intermediate conductive layer 134, and the lower conductive layer 132 by using the lower capping pattern 142B, the insulating layer pattern 144, and the upper capping pattern 146 as etching masks, the bit line BL including the lower conductive pattern 132B, the intermediate conductive pattern 134B, and the upper conductive pattern 136B is formed.

In a process of forming the bit line BL, a part of a side wall of the direct contact DC may be removed and a part of the direct contact hole DCH may be exposed. Then, the insulation liners 148 are conformally formed on the side walls and upper surface of the bit line BL. In a process of forming the insulation liners 148, the insulation liner 148R may be conformally formed on the inner wall of the direct contact hole DCH. Then, the insulating layer filling the inner wall of the direct contact hole DCH may be formed and the direct contact spacer 154 filling the inside of the direct contact hole DCH may be formed by performing anisotropic etching on the insulating layer.

Then, the first spacers 140B and the second spacers 140A covering the insulation liners 148 are formed on the side walls of the bit line BL. Each of the first spacers 140B and the second spacers 140A may include a silicon oxide layer, a silicon nitride layer, or a silicon oxynitride layer. In the cell array region MCA, the plurality of insulation fences (not shown) may be formed among the bit lines BL in the second direction. Between adjacent insulation fences among the insulation fences and adjacent bit lines BL, one contact hole 156S may be defined.

Figure 17:
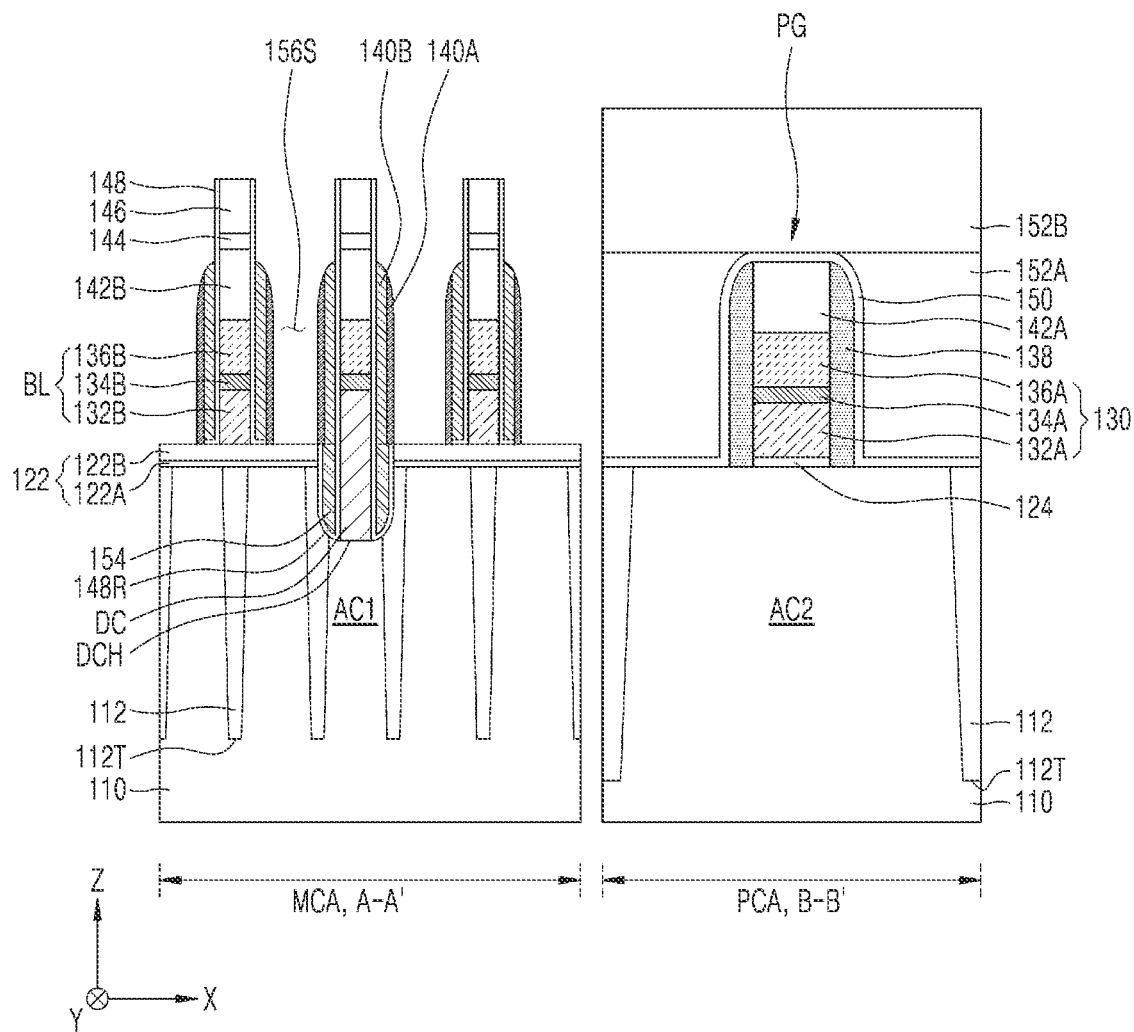

Referring to FIG. 17, while the insulation fences of FIG. 16 are formed, parts of upper sides of the first spacers 140B and the second spacers 140A exposed to an etching atmosphere may be removed together. In some embodiments, after forming the plurality of insulation fences, an etch back process for reducing heights of the first spacers 140B and the second spacers 140A may be performed further.

Figure 18:
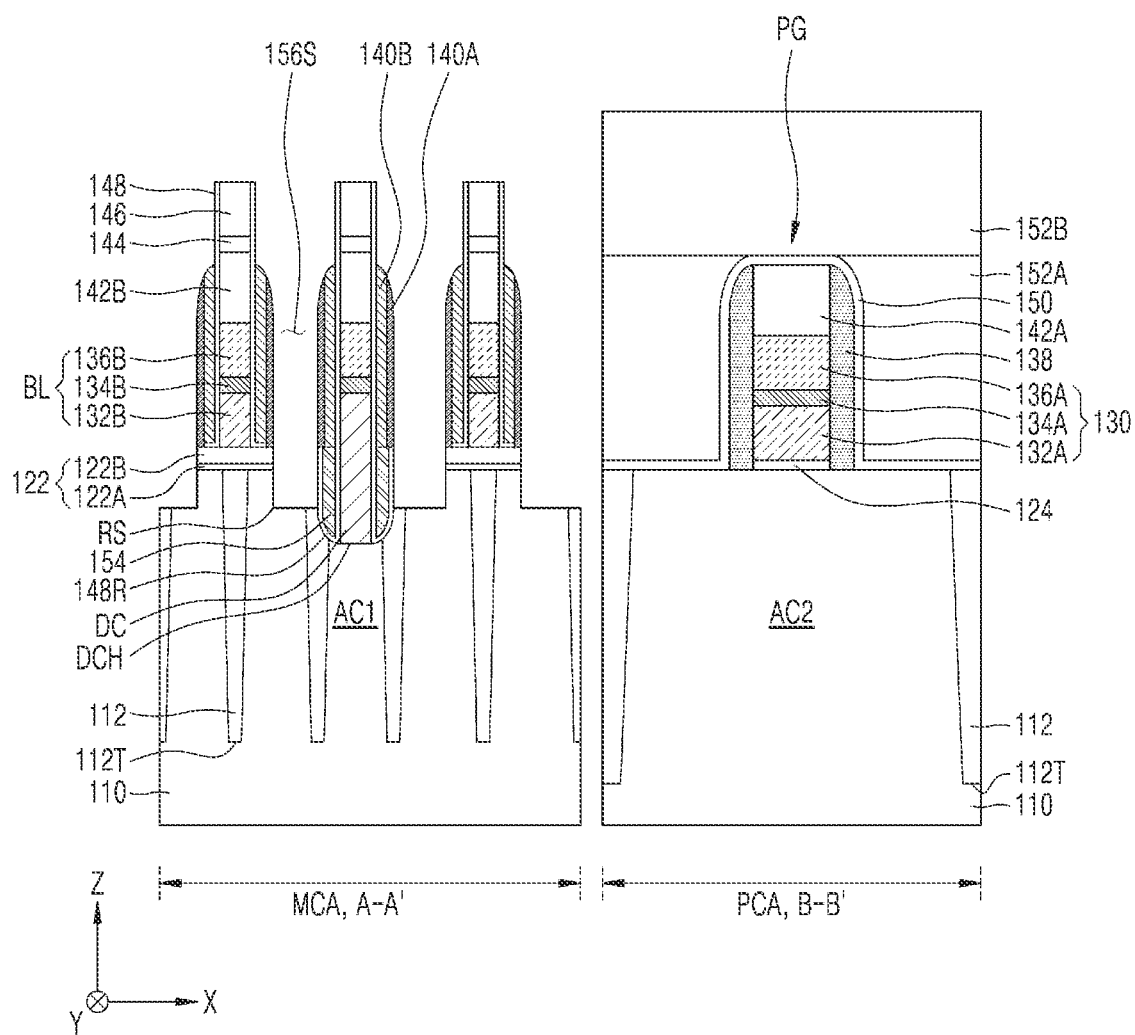

Referring to FIG. 18, by removing parts of the buffer layer 122 and the substrate 110 exposed through the contact hole 156S, a recessed portion RS exposing the cell active region AC1 of the substrate 110 between the bit lines BL is formed.

Figure 19:
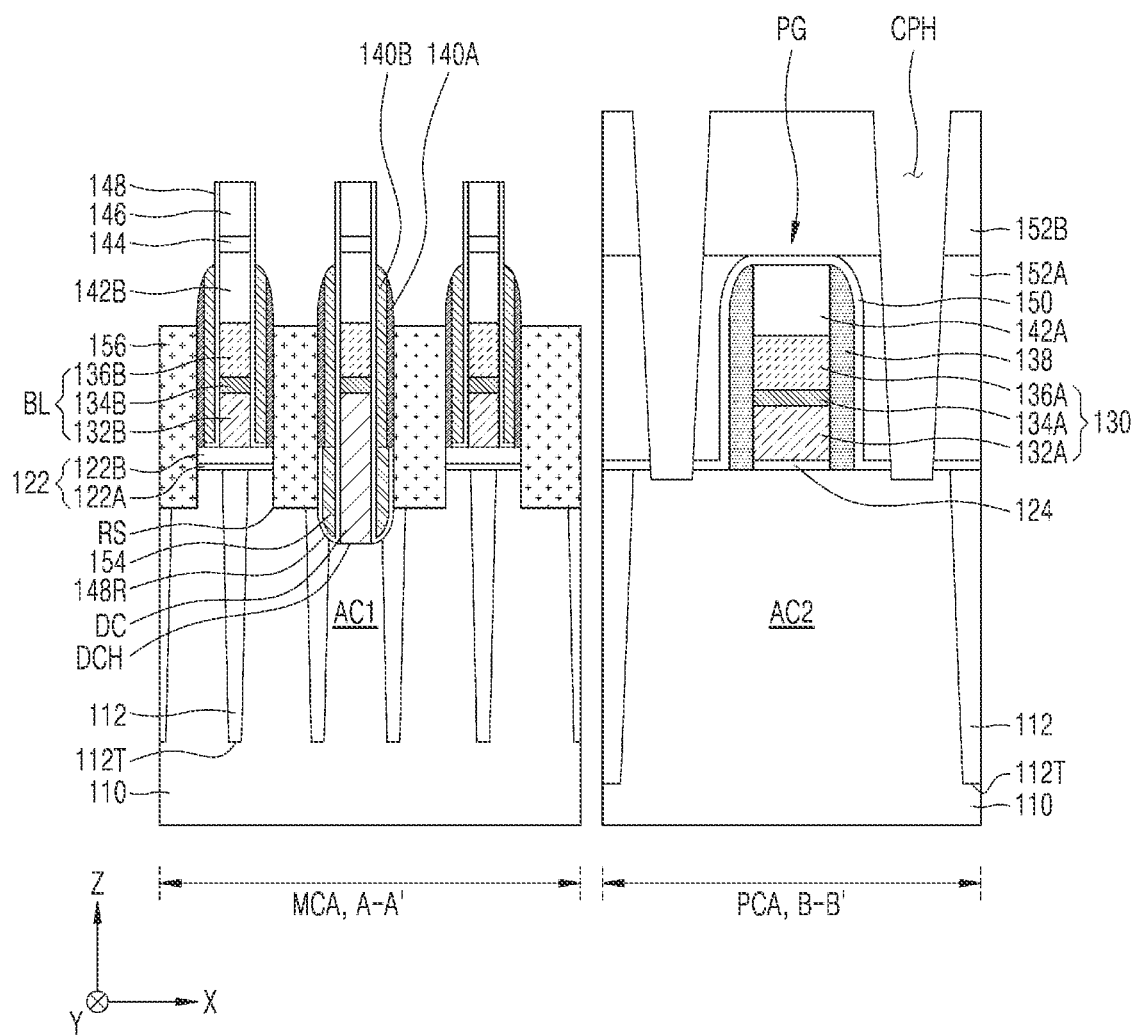

Referring to FIG. 19, in the cell array region MCA, the contact plug 156 filling a part of the contact hole 156S between the bit lines BL while filling the recessed portion RS between the bit lines BL is formed. The contact plug 156 may include a doped silicon layer.

In some embodiments, when the contact plug 156 is formed, void(s) and/or seam(s) may be included in the silicon layer filling the contact hole 156S. Accordingly, when void(s) and/or seam(s) are formed in the contact plug 156, the silicon layer may be entirely or partially annealed by selectively applying thermal energy from a laser to the silicon layer in order to remove the void(s) and/or seam(s) to provide a holistic silicon layer for the contact plug 156.

In the peripheral circuit region PCA, by etching the upper insulation capping layer 152B, the interlayer insulating layer 152A, and the protective layer 150, peripheral contact holes CPH exposing the peripheral circuit active region AC2 of the substrate 110 are formed.

Figure 20:
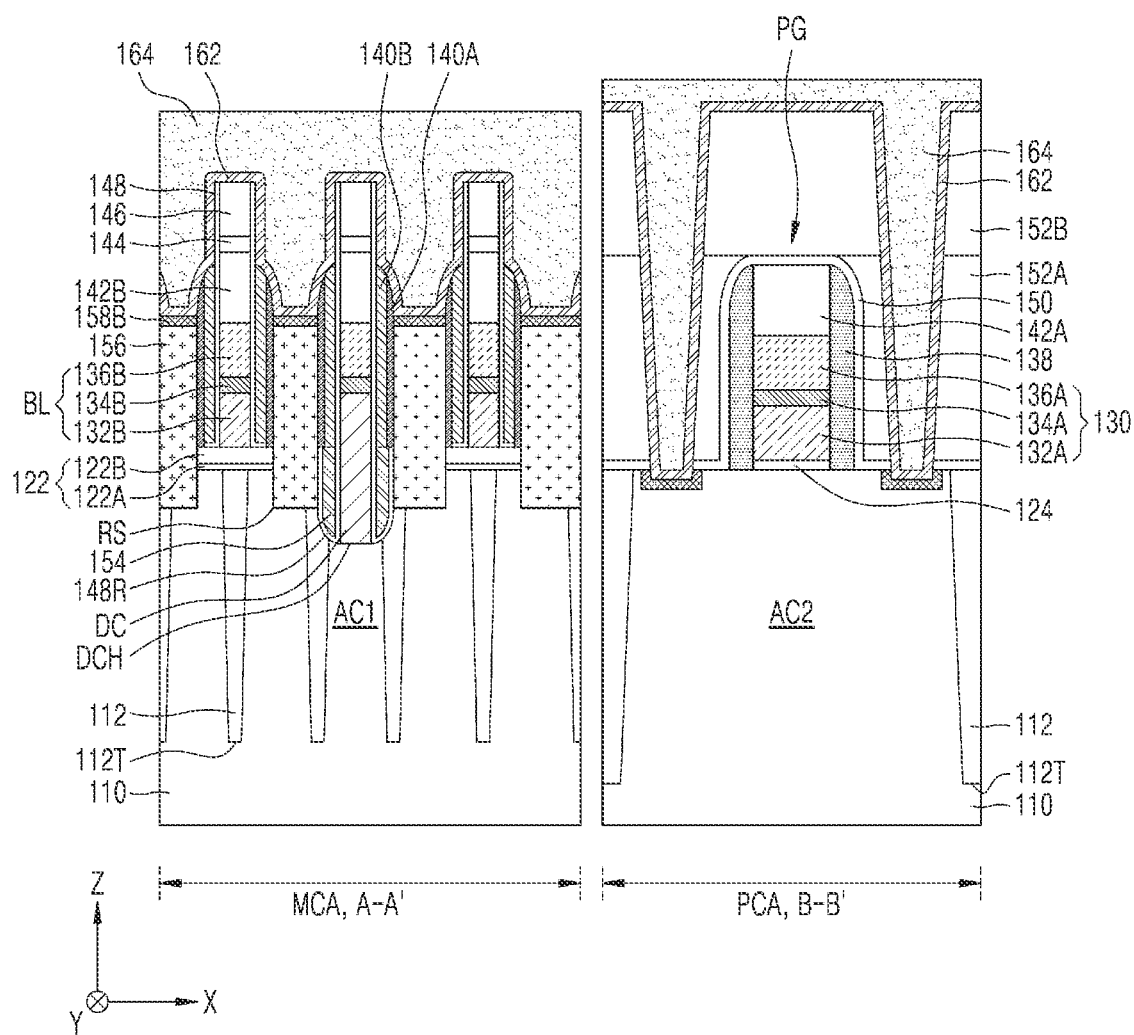

Referring to FIG. 20, the metal silicide layers 158B may be formed on the contact plugs 156 exposed through the contact holes 156S in the cell array region MCA and the metal silicide layers 158A may be formed on a surface of the peripheral circuit active region AC2 exposed through the peripheral contact holes CPH in the peripheral circuit region PCA.

The metal silicide layers 158A and 158B may be simultaneously formed or may be formed in separate processes. Then, in the cell array region MCA and the peripheral circuit region PCA, a conductive barrier layer 162 and a conductive layer 164 covering an exposed surface may be formed on the substrate 110.

Figure 21:
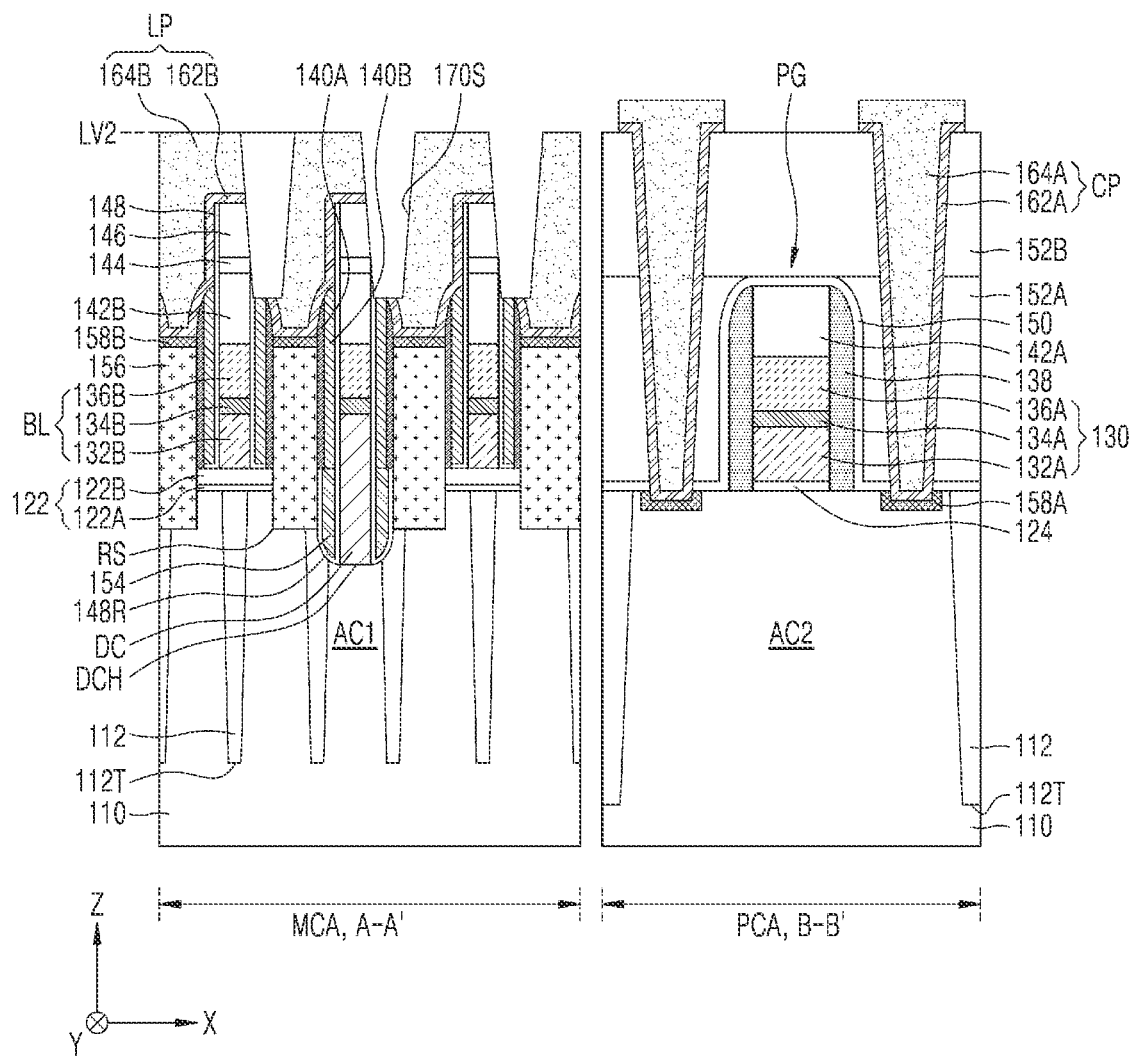

Referring to FIG. 21, in the cell array region MCA and the peripheral circuit region PCA, the conductive barrier layer 162 and the conductive layer 164 are patterned. Therefore, in the cell array region MCA, the landing pads LP including the conductive barrier layers 162B and the landing pad conductive layers 164B are formed.

In addition, in the peripheral circuit region PCA, the peripheral contact plugs CP including the conductive barrier layers 162A and the landing pad conductive layers 164A are formed. The landing pads LP may be provide in an island pattern, as shown in FIG. 10. The landing pads LP may vertically overlap parts of the bit lines BL on the metal silicide layers 158B. As the landing pads LP are in the island pattern, the insulation spaces 170S surrounding the landing pads LP may be formed.

The insulating layers 170 filling the insulation spaces 170S around the landing pads LP may be formed as illustrated in FIG. 10. The landing pads LP may be electrically isolated from one another by the insulating layers 170 filling the insulation spaces 170S. The insulating layers 170 may include $SiO_2$, SiOCH, SiOC, silicon nitride, or silicon oxynitride. The insulating layers 170 may include the insulating material that may fill the insulation spaces 170S by the spin coating process, the CVD process, or the flowable CVD process. Then, in the cell array region MCA, capacitor lower electrodes (not shown) may be formed on the landing pads LP.

Figure 22:
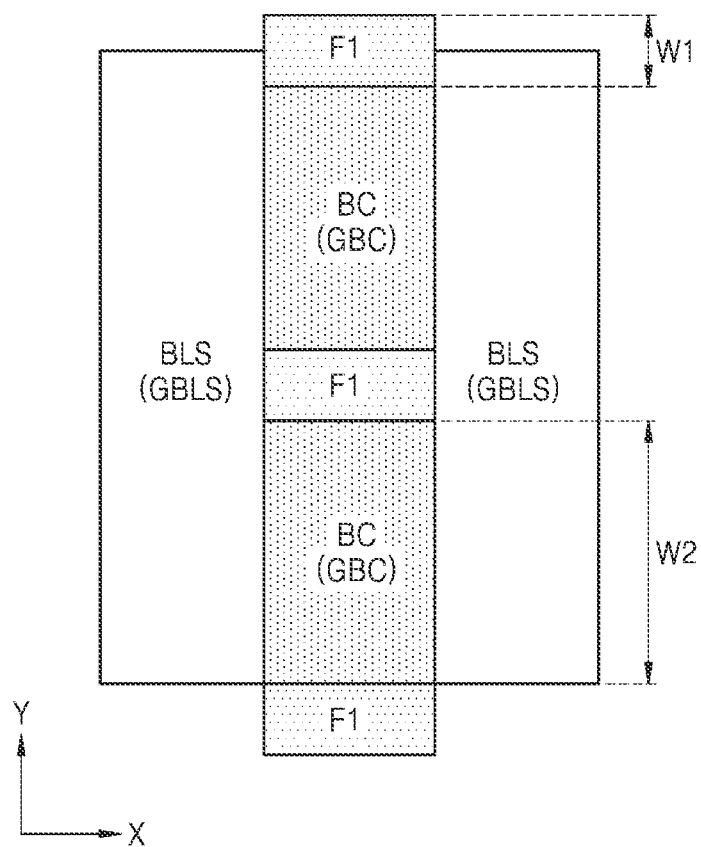
FIG. 22 is a layout diagram further illustrating a manufacturing processes for a bit line structure and a buried contact of an integrated circuit device according to embodiments of the inventive concept.

FIG. 22 is a layout (or top-down) diagram further illustrating the manufacturing processes associated with a bit line structure and a buried contact for integrated circuit devices according to embodiments of the inventive concept. In particular, FIG. 22 is a layout diagram further illustrating the bit line BL and the buried contact BC of FIG. 19. The buried contact BC may correspond to the contact plug 156 and the bit line structure BLS may correspond to the bit lines BL, the lower capping pattern 142B, the insulating layer pattern 144, the upper capping pattern 146, the insulation liners 148, the first spacers 140B, and the second spacers 140A.

Here, in a global buried contact (GBC) or a global bit line structure (GBLS), G as an abbreviation of global may mean that, as a word line has a buried structure in a cell array region like in the integrated circuit device 100 according to the current embodiment, a bit line BL of the cell array region is at the same level as a gate structure PG (a peripheral word line) of a peripheral circuit region.

The area indicated as F1 in FIG. 22 denotes the insulation fences. The insulation fences F1 may include one nor more insulating material(s) (e.g., oxide and/or nitride). The insulation fences F1 may surround both sides of the buried contact BC in the second direction. Left and right sides of the buried contact BC may be surrounded by the bit line structures BLS and in the first direction, and upper and lower sides of the buried contact BC may be surrounded by the insulation fences F1 in the second direction. When a width W2 of the insulation fence F1 in the second direction is minimized, by increasing a width W2 of the buried contact BC in the second direction, contact resistance may be reduced.

Figure 23:
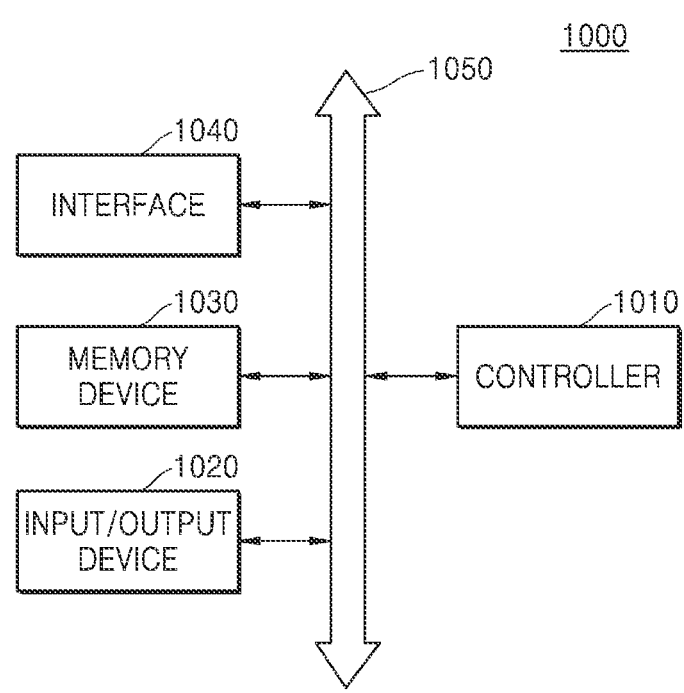
FIG. 23 is a system including an integrated circuit device according to embodiments of the inventive concept.

FIG. 23 is a system 1000 including an integrated circuit device according to embodiments of the inventive concept.

Here, system 1000 may include a controller 1010, an input/output device 1020, a memory device 1030, and an interface 1040. The system 1000 may be a mobile system or a system transmitting or receiving information. In some embodiments, the mobile system may be a personal digital assistant (PDA), a portable computer, a web tablet, a wireless phone, a mobile phone, a digital music player, or a memory card.

The controller 1010 for controlling an execution program in the system 1000 may be a microprocessor, a digital signal processor, a microcontroller, or a similar device. The input/output device 1020 may be used for inputting or outputting data of the system 1000. The system 1000 may be connected to an external device, for example, a personal computer (PC) or a network by using the input/output device 1020 and may exchange data with the external device. The input/output device 1020 may be, for example, a keypad, a keyboard, or a display.

The memory device 1030 may store a code and/or data for an operation of the controller 1010 or may store data processed by the controller 1010. The memory device 1030 may include the integrated circuit device according to the inventive concept. The interface 1040 may be a data transmission path between the system 1000 and another external device. The controller 1010, the input/output device 1020, the memory device 1030, and the interface 1040 may communicate with each other through a bus 1050.

The system 1000 according to the current embodiment may be used for, for example, a mobile phone, a MP3 player, a navigation, a portable multimedia player (PMP), a solid state disk (SSD), or household appliances.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a substrate;
   a first active region and a second active region spaced apart in the substrate;
   a first contact plug contacting the first active region and having a first width and a first dopant concentration; and
   a second contact plug contacting the second active region and having a second width greater than the first width and a second dopant concentration less than the first dopant concentration.

2. The integrated circuit device of claim 1, wherein the first contact plug contacts only part of the first active region, and the second contact plug contacts only part of the second active region.

3. The integrated circuit device of claim 1, wherein each of the first contact plug and the second contact plug includes doped silicon.

4. The integrated circuit device of claim 1, wherein the first active region is formed in an upper surface of the substrate to a first depth, and the second active region is formed in the upper surface of the substrate to a second depth different from the first depth.

5. The integrated circuit device of claim 4, further comprising:
   a first recessed portion formed in the upper surface of the substrate in the first active region, wherein the first contact plug is at least partially buried in the first recessed portion; and
   a second recessed portion formed in the upper surface of the substrate in the second active region, wherein the second contact plug is at least partially buried in the second recessed portion.

6. The integrated circuit device of claim 5, wherein the first recessed portion is formed in the upper surface of the substrate to a first recessed depth, and
   the second recessed portion is formed in the upper surface of the substrate to a second recessed depth different from the first recess depth.

7. The integrated circuit device of claim 1, wherein the first contact plug is a single layer of a first semiconductor layer having the first dopant concentration, and
   the second contact plug is a multilayer including a second semiconductor layer having the first dopant concentration and a third semiconductor layer having the second dopant concentration less than the first dopant concentration.

8. The integrated circuit device of claim 1, wherein the first contact plug includes a first holistic material layer, and the second contact plug includes a second holistic material layer different from the first holistic material layer.

9. An integrated circuit device comprising:
   a first active region, a second active region and a third active region spaced apart in a substrate;
   a first contact plug having a first width and a first dopant concentration, and contacting at least part of the first active region;
   a second contact plug having a second width and a second dopant concentration less than the first dopant concentration, and contacting at least a part of the second active region; and
   a third contact plug having a third width, having a third dopant concentration less than the first dopant concentration and less than the second dopant concentration, and contacting at least part of the third active region.

10. The integrated circuit device of claim 9, wherein the first active region, the second active region, and the third active region are configured in the substrate as a substrate level, and the first contact plug, the second contact plug and the third contact plug are configured as a contact level disposed on the substrate level.

11. The integrated circuit device of claim 10, further comprising:
    an additional semiconductor layer level disposed on the contact level.

12. The integrated circuit device of claim 9, further comprising:
    a first recessed portion formed in an upper surface of the substrate in the first active region, wherein the first contact plug is at least partially buried in the first recessed portion;
    a second recessed portion formed in the upper surface of the substrate in the second active region, wherein the second contact plug is at least partially buried in the second recessed portion; and
    a third recessed portion formed in the upper surface of the substrate in the third active region, wherein the third contact plug is at least partially buried in the third recessed portion,
    wherein the first active region is formed in the upper surface of the substrate to a first depth, the second active region is formed in the upper surface of the substrate to a second depth, and the third active region is formed in the upper surface of the substrate to a third depth.

13. The integrated circuit device of claim 12, wherein the first recessed portion, the second recessed portion and the third recessed portion are formed in the upper surface of the substrate to different recess depths, and the first depth, the second depth and the third depth are different.

14. The integrated circuit device of claim 9, wherein the first contact plug is a single layer of a first semiconductor layer having the first dopant concentration, the second contact plug is a first multilayer including a second semiconductor layer having the first dopant concentration and a third semiconductor layer having the second dopant concentration less than the first dopant concentration, and the third contact plug is a second multilayer including a fourth semiconductor layer having the first dopant concentration and a fifth semiconductor layer having the second dopant concentration.

15. An integrated circuit device comprising:

word lines extending in a first direction across a substrate and spaced apart in a second direction different from the first direction;

bit lines extending on the word lines in the second direction and spaced apart in the first direction;

a first contact plug arranged among the bit lines, contacting a first active region of the substrate, having a first width, and having a first dopant concentration; and a second contact plug arranged among the bit lines, contacting a second active region of the substrate, having a second width, and having a second dopant concentration less than the first dopant concentration.

16. The integrated circuit device of claim 15, wherein the second width is greater than the first width.

17. The integrated circuit device of claim 15, wherein the first active region is formed in an upper surface of the substrate to a first depth, and the second active region is formed in the upper surface of the substrate to a second depth different from the first depth.

18. The integrated circuit device of claim 15, wherein the first contact plug is a first holistic material layer including a single layer of a first semiconductor layer having the first dopant concentration, and the second contact plug is a second holistic material layer including a multilayer including a second semiconductor layer having the first dopant concentration and a third semiconductor layer having the second dopant concentration less than the first dopant concentration.

19. The integrated circuit device of claim 18 further comprising:

a first recessed portion formed in an upper surface of the substrate in the first active region, wherein the first contact plug is at least partially buried in the first recessed portion; and a second recessed portion formed in the upper surface of the substrate in the second active region, wherein the second contact plug is at least partially buried in the second recessed portion.

20. The integrated circuit device of claim 15, further comprising:

a third contact plug arranged among the bit lines, contacting a third active region of the substrate, having a third width greater than the first width and the second width, and having a third dopant concentration less than the first dopant concentration and less than the second dopant concentration.

* * * * *